United States Patent
Huai et al.

(10) Patent No.: US 6,829,161 B2
(45) Date of Patent: Dec. 7, 2004

(54) MAGNETOSTATICALLY COUPLED MAGNETIC ELEMENTS UTILIZING SPIN TRANSFER AND AN MRAM DEVICE USING THE MAGNETIC ELEMENT

(75) Inventors: Yiming Huai, Pleasanton, CA (US); Frank Albert, Redwood City, CA (US); Paul P. Nguyen, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 10/339,962

(22) Filed: Jan. 10, 2003

(65) Prior Publication Data

US 2004/0136231 A1 Jul. 15, 2004

(51) Int. Cl.[7] .............................................. G11C 11/00
(52) U.S. Cl. ........................ 365/158; 365/171; 365/173
(58) Field of Search ................................ 365/158, 171, 365/173, 97

(56) References Cited

U.S. PATENT DOCUMENTS

| | | | |
|---|---|---|---|
| 6,292,389 B1 * | 9/2001 | Chen et al. ................. | 365/173 |
| 6,376,260 B1 * | 4/2002 | Chen et al. ................. | 365/171 |
| 6,438,026 B2 * | 8/2002 | Gillies et al. ............... | 365/158 |
| 6,532,164 B2 | 3/2003 | Redon et al. ................ | 365/97 |
| 2002/0105827 A1 | 8/2002 | Redon et al. ............... | 365/173 |
| 2003/0007398 A1 | 1/2003 | Daughton et al. .......... | 365/200 |
| 2003/0059588 A1 | 3/2003 | Hannah et al. ............. | 428/200 |

* cited by examiner

Primary Examiner—Huan Hoang
(74) Attorney, Agent, or Firm—Sawyer Law Group LLP

(57) ABSTRACT

A method and system for providing a magnetic element capable of being written using the spin-transfer effect and a magnetic memory using the magnetic element are disclosed. The magnetic element includes a spin tunneling junction, a separation layer and a spin valve. In an alternate embodiment, the spin tunneling junction and/or spin valve may be dual. The separation layer is between a first free layer of the spin tunneling junction and a second free layer of the spin valve. The separation layer is configured so that the two free layers are magnetostatically coupled, preferably with their magnetizations antiparallel. In an alternate embodiment, having a dual spin valve and a dual spin tunneling junction, the separation layer may be omitted, and the appropriate distance provided using an antiferromagnetic layer. Another embodiment includes shaping the element such that the spin valve has a smaller lateral dimension than the spin tunneling junction.

45 Claims, 13 Drawing Sheets

MAGNETOSTATICALLY COUPLED MAGNETIC ELEMENTS UTILIZING SPIN TRANSFER AND AN MRAM DEVICE USING THE MAGNETIC ELEMENT

FIELD OF THE INVENTION

The present invention relates to magnetic memory systems, and more particularly to a method and system for providing an element that employs a spin transfer effect in switching and that can be used in a magnetic memory such as magnetic random access memory ("MRAM").

BACKGROUND OF THE INVENTION

Magnetic memories are often used in storing data. One type of memory element currently of interest utilizes magnetoresistance of a magnetic element for storing data FIGS. 1A and 1B depict conventional magnetic elements 1 and 1'. The conventional magnetic element 1 is a spin valve 1 and includes a conventional antiferromagnetic layer 2, a conventional pinned layer 4, a conventional spacer layer 6 and a conventional free layer 8. The conventional pinned layer 4 and the conventional free layer 8 are ferromagnetic. The conventional spacer layer 6 is norunagnetic. The conventional spacer layer 6 is conductive. The antiferromagnetic layer 2 is used to fix, or pin, the magnetization of the pinned layer 4 in a particular direction. The magnetization of the free layer 8 is free to rotate, typically in response to an external magnetic field.

The conventional magnetic element 1' is a spin tunneling junction. Portions of the conventional spin tunneling junction 1' are analogous to the conventional spin valve 1. Thus, the conventional magnetic element 1' includes an antiferromagnetic layer 2', a conventional pinned layer 4', an insulating barrier layer 6' and a free layer 8'. The conventional barrier layer 6' is thin enough for electrons to tunnel through in a conventional spin tunneling junction 1'.

Depending upon the orientations of the magnetizations of the free layer 8 or 8' and the pinned layer 4 or 4', respectively, the resistance of the conventional magnetic element 1 or 1', respectively, changes. When the magnetizations of the free layer 8 and pinned layer 4 are parallel, the resistance of the conventional spin valve 1 is low. When the magnetizations of the free layer 8 and the pinned layer 4 are antiparallel, the resistance of the conventional spin valve 1 is high. Similarly, when the magnetizations of the free layer 8' and pinned layer 4' are parallel, the resistance of the conventional spin tunneling junction 1' is low. When the magnetizations of the free layer 8' and pinned layer 4' are antiparallel, the resistance of the conventional spin tunneling junction 1' is high.

In order to sense the resistance of the conventional magnetic element 1/1', current is driven through the conventional magnetic element 1/1'. Current can be driven through the conventional magnetic element 1 in one of two configurations, current in plane ("CIP") and current perpendicular to the plane ("CPP"). However, for the conventional spin tunneling junction 1', current is driven in the CPP configuration. In the CIP configuration, current is driven parallel to the layers of the conventional spin valve 1. Thus, in the CIP configuration, current is driven from left to right or right to left as seen in FIG. 1A. In the CPP configuration, current is driven perpendicular to the layers of conventional magnetic element 1/1'. Thus, in the CPP configuration, current is driven up or down as seen in FIG. 1A or 1B. The CPP configuration is used in MRAM having a conventional spin tunneling junction 1' in a memory cell.

FIG. 2 depicts a conventional memory array 10 using conventional memory cells 20. Each conventional memory cell 20 includes a conventional magnetic element 1/1', depicted as a resistor in FIG. 2. The conventional memory array 10 typically uses a spin tunneling junction 1'. The conventional array 10 is shown as including four conventional memory cells 20. Each memory cell 20 includes a conventional spin tunneling junction 1' and a transistor 22. The memory cells 20 are coupled to reading/writing column selection 30 via bit lines 32 and 34 and to row selection 50 via word lines 52 and 54. Also depicted are write lines 60 and 62 which carry currents that generate external magnetic fields for the corresponding conventional memory cells 20 during writing. The reading/writing column selection 30 is coupled to write current source 42 and read current source 40 which are coupled to a voltage supply Vdd 48 via line 46.

In order to write to the conventional memory array 10, the write current Iw 42 is applied to the bit line 32 or 34 selected by the reading/writing column selection 30. The read current Ir 40 is not applied. Both word lines 52 and 54 are disabled. The transistors 22 in all memory cells are disabled. In addition, one of the write lines 60 and 62 selected carries a current used to write to the selected conventional memory cell 20. The combination of the current in the write line 60 or 62 and the current in the bit line 32 or 34 generates a magnetic field large enough to switch the direction of magnetization of the free layer 8' and thus write to the desired conventional memory cell 20. Depending upon the data written to the conventional memory cell 20, the conventional magnetic tunneling junction 1' will have a high resistance or a low resistance.

When reading from a conventional cell 20 in the conventional memory array 10, the read current Ir 40 is applied instead. The memory cell 20 selected to be read is determined by the row selection 50 and column selection 30. The output voltage is read at the output line 44.

Although the conventional magnetic memory 10 using the conventional spin tunneling junction 1' can function, one of ordinary skill in the art will readily recognize that there are barriers to the use of the conventional magnetic element 1' and the conventional magnetic memory 10 at higher memory cell densities. In particular, the conventional memory array 10 is written using an external magnetic field generated by currents driven through the bit line 32 or 34 and the write line 60 or 62. In other words, the magnetization of the free layer 8' is switched by the external magnetic field generated by current driven through the bit line 32 or 34 and the write line 60 or 62. The magnetic field required to switch the magnetization of the free layer 8', known as the switching field, is inversely proportional to the width of the conventional magnetic element 1'. As a result, the switching field increases for conventional memories having smaller magnetic elements 1'. Because the switching field is higher, the current required to be driven through the bit line 32 or 34 and particularly through the write line 60 or 62 increases dramatically for higher magnetic memory cell density. This large current can cause a host of problems in the conventional magnetic memory 10. For example, cross talk and power consumption would increase. In addition, the driving circuits required to drive the current that generates the switching field at the desired memory cell 20 would also increase in area and complexity. Furthermore, the conventional write currents have to be large enough to switch a magnetic memory cell but not so large that the neighboring cells are inadvertently switched. This upper limit on the write current amplitude can lead to reliability issues because the cells that are harder to switch than others (due to fabrication and material nonuniformity) will fail to write consistently.

Accordingly, what is needed is a system and method for providing a magnetic memory element which can be used in a memory array of high density, low power consumption, low cross talk, and high reliability, while providing sufficient read signal. The present invention addresses the need for such a magnetic memory element.

SUMMARY OF THE INVENTION

The present invention provides a method and system for providing a magnetic element capable of being written using spin-transfer effect and a magnetic memory using the magnetic element. The magnetic element includes a spin tunneling junction and a spin valve, preferably separated by a separation layer. The spin tunneling junction includes a first free layer, a barrier layer and a first pinned layer. The first pinned layer is ferromagnetic and has a first pinned layer magnetization that is pinned in a first direction. The first free layer is ferromagnetic and has a first free layer magnetization. The barrier layer resides between the first pinned layer and the first free layer, is an insulator, and has a thickness that allows tunneling through the barrier layer. The spin valve has a second pinned layer, a nonmagnetic spacer layer and a second free layer. The second pinned layer is ferromagnetic and has a second pinned layer magnetization that is pinned in a second direction. The second free layer is ferromagnetic and has a second free layer magnetization. The nonmagnetic spacer layer is conductive and resides between the second free layer and the second pinned layer. The separation layer resides between the first free layer of the spin tunneling junction and the second free layer of the spin valve. The separation layer is configured to allow the first free layer and the second free layer to be magnetostatically coupled. In addition, the magnetic element is configured to allow the second free layer magnetization to change direction due to spin transfer when a write current is passed through the magnetic element in a CPP direction. Furthermore, the magnetic element can be shaped such that the spin valve portion has a smaller lateral dimension than the spin tunneling junction portion.

According to the system and method disclosed herein, the present invention provides a magnetic element and a magnetic memory that is capable of being written using the more efficient and localized spin-transfer mechanism while requiring a reduced current for writing and providing a high readout signal. In addition, the free layers of the spin valve and spin tunneling junction can be separately tailored to improve the functions of the spin valve and spin tunneling junction, respectively. Moreover, in embodiments in which the spin valve portion has a smaller lateral dimension, it is possible to have a higher current density in the spin valve portion than in the spin tunneling portion. This feature allows a sufficiently high current density for writing using the spin transfer effect while reducing the possibility that the barrier layer(s) of the spin tunneling junction will undergo breakdown.

DETAILED DESCRIPTION OF THE INVENTION

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1A:
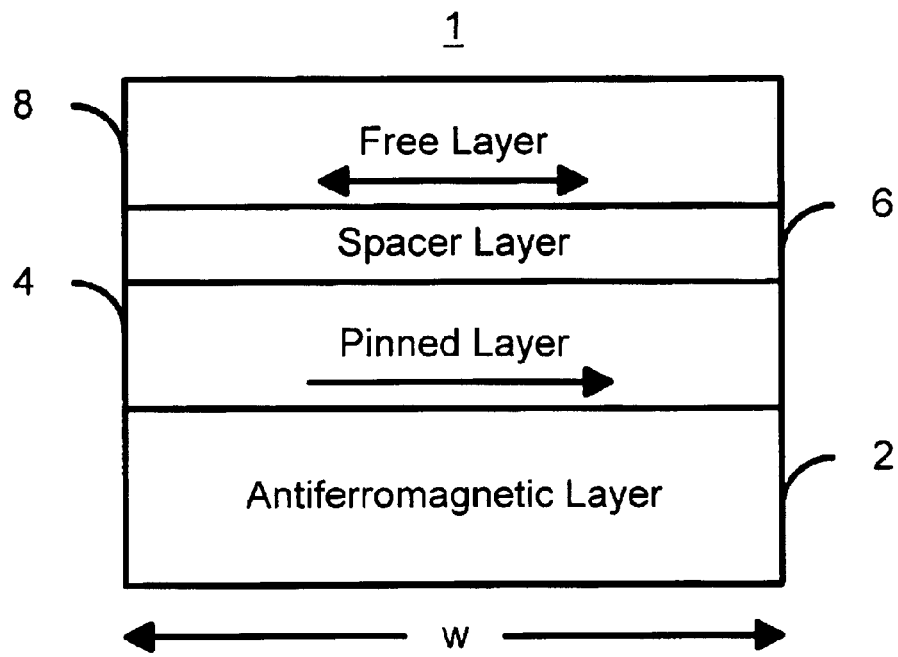
FIG. 1A is a diagram of a conventional magnetic element, a spin valve.
Figure 1B:
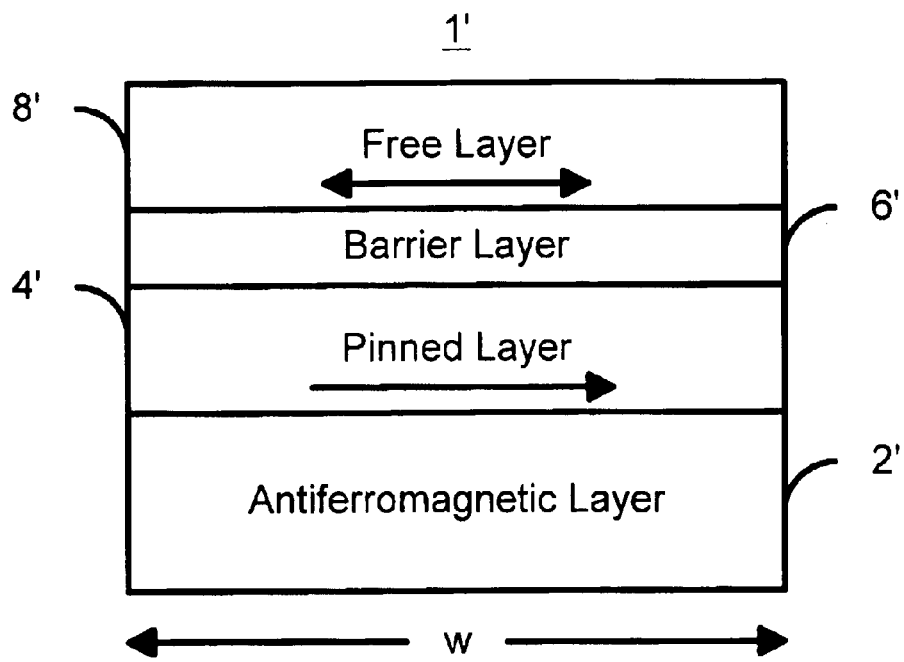
FIG. 1B is a diagram of a conventional magnetic element, a spin tunneling junction, such as an element used in a magnetic memory.
Figure 2:
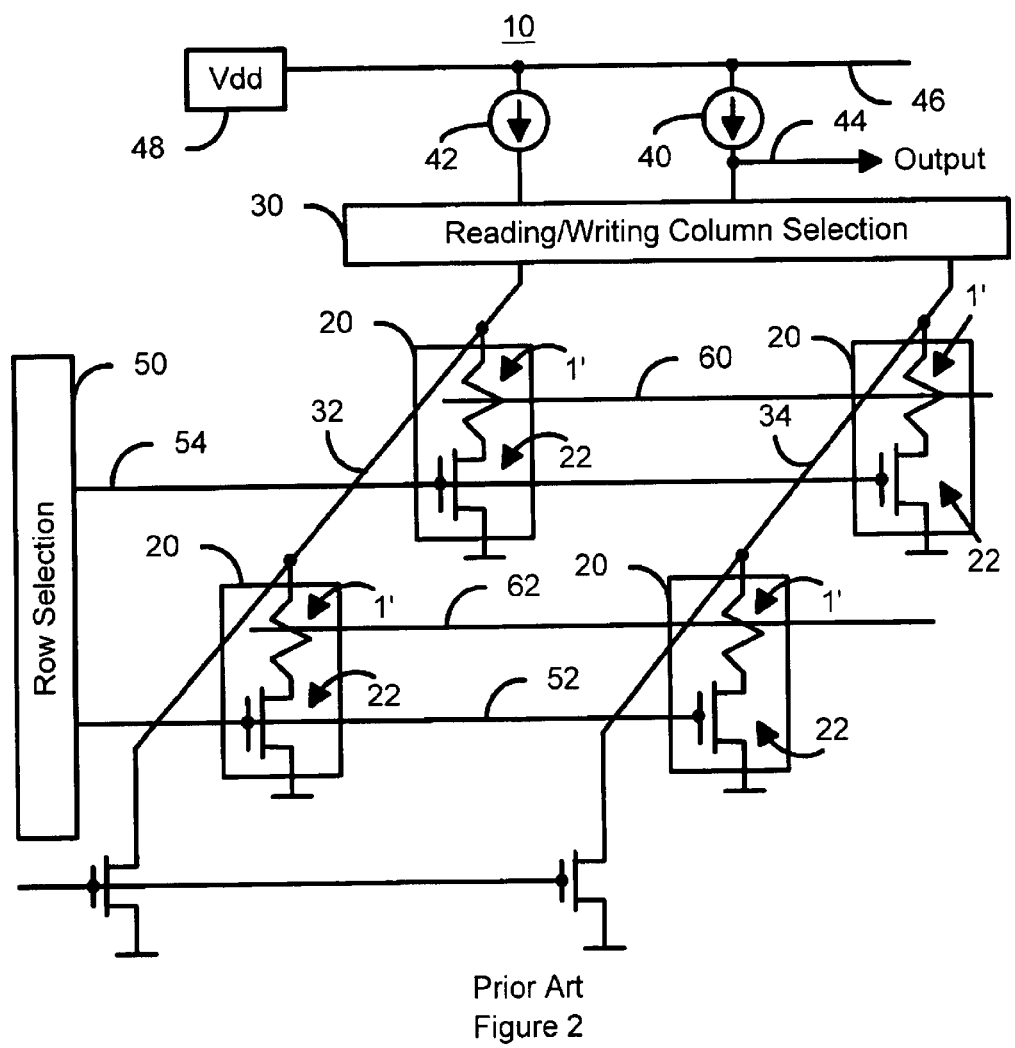
FIG. 2 is a diagram of a conventional magnetic memory array.

As described above, one of the challenges faced in increasing the density of conventional magnetic memories is the large current required to write to the conventional magnetic memories, such as the conventional magnetic memory 10 depicted in FIG. 2 and using the conventional magnetic elements 1' of FIG. 1B. In other words, the current required to generate the magnetic field that switches the direction of the magnetization of the free layer is large. This large current can be problematic because it can result in cross talk and high power consumption.

In order to overcome some of the issues associated with magnetic memories having a higher density of memory cells, a recently discovered phenomenon, spin transfer, may be utilized. Current knowledge of spin transfer is described in detail in J. C. Slonczewski, "Current-driven Excitation of Magnetic Multilayers," *Journal of Magnetism and Magnetic Materials*, vol. 159, p. L1–L5 (1996); L. Berger, "Emission of Spin Waves by a Magnetic Multilayer Traversed by a Current," *Phys. Rev. B*, Vol. 54, p. 9353 (1996), and in F. J. Albert, J. A. Katine and R. A. Buhman, "Spin-polarized Current Switching of a Co Thin Film Nanomagnet," *Appl. Phys. Lett.*, vol. 77, No. 23, p. 3809–3811 (2000). Thus, the following description of the spin transfer phenomenon is based upon current knowledge in the area and is not intended to limit the scope of the invention.

The spin-transfer effect arises from the spin-dependent electron transport properties of ferromagnetic-normal metal multilayers. When a spin-polarized current traverses a magnetic multilayer in a CPP configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$–$10^8$ A/cm$^2$), and if the dimensions of the multilayer are small (approximately less than two hundred nanometers) so that effects of the helical magnetic field produced by the perpendicular current are not important. In addition, for spin transfer to be able to switch the magnetization direction of a ferromagnetic layer, the ferromagnetic layer should be sufficiently thin, for instance, preferably less than approximately ten nanometers for Co.

The phenomenon of spin transfer can be used in the CPP configuration as an alternative to or in addition to using an external switching field to switch the direction of magnetization of the free layer 8 or 8' of the conventional spin valve 1 or the conventional spin tunneling junction 1', respectively. Spin transfer is a phenomenon which dominates other mechanisms and becomes observable when the dimensions of the conventional magnetic element 1/1' are small, in the range of few hundred nanometers. Consequently, spin transfer is suitable for higher density magnetic memories having smaller magnetic elements 1/1'.

For example, switching the magnetization of the conventional free layer 8 in the conventional spin valve 1 using spin transfer is described. Current can be driven from the conventional free layer 8 to the conventional pinned layer 4 to switch the magnetization of the conventional free layer 8 to be parallel to the magnetization of the conventional pinned layer 4. The magnetization of the conventional free layer 8 is assumed to be initially antiparallel to the conventional pinned layer 4. When current is driven from the conventional free layer 8 to the conventional pinned layer 4, conduction electrons travel from the conventional pinned layer 4 to the conventional free layer 8. The majority electrons traveling from the conventional pinned layer 4 have their spins polarized in the same direction as the magnetization of the conventional pinned layer 4. These electrons interact with the magnetic moments of the conventional free layer 8 near the interface between the conventional free layer 8 and the conventional spacer layer 6. As a result of this interaction, the electrons transfer their spin angular momentum to the conventional free layer 8. Thus, angular momentum corresponding to spins antiparallel to the magnetization of the conventional free layer 8 (and parallel to the conventional pinned layer 4) is transferred to the conventional free layer. If sufficient angular momentum is transferred by the electrons, the magnetization of the conventional free layer 8 can be switched to be parallel to the magnetization of the conventional pinned layer 4.

Alternatively, current can be driven from the conventional pinned layer 4 to the conventional free layer 8 to switch the magnetization of the conventional free layer 8 to be antiparallel to the magnetization of the conventional pinned layer 8. In this case the magnetization of the free layer 8 is assumed to be initially parallel to the pinned layer 4. When current is driven from the conventional pinned layer 4 to the conventional free layer 8, conduction electrons travel in the opposite direction. The majority electrons have their spins polarized in the direction of magnetization of the conventional free layer 8, which is originally magnetized in the same direction as the conventional pinned layer 4. These majority electrons are transmitted through the conventional pinned layer 4. However, the minority electrons, which have spins polarized antiparallel to the magnetization of the conventional free layer 8 and the conventional pinned layer 4, will be reflected from the conventional pinned layer 4 and travel back to the conventional free layer 8. The minority electrons reflected by the conventional pinned layer 4 interact with magnetic moments of the conventional free layer 8 and transfer at least a portion of their spin angular momentum to the conventional free layer 8. If sufficient angular momentum is transferred by the electrons to the conventional free layer 8, the magnetization of the free layer 8 can be switched to be antiparallel to the magnetization of the conventional pinned layer 4.

Using a current driven through the conventional magnetic elements 1 or 1' in the CPP configuration, spin transfer can switch the direction of magnetization of the free layer 8 or 8', respectively. Thus, spin transfer can be used to write to magnetic elements 1 or 1' in a magnetic memory by using a current through the conventional magnetic element 1 or 1'. The mechanism of spin-transfer writing is, therefore, more localized and generates less cross talk. Spin transfer is also more reliable because spin transfer results in a high effective field in the conventional magnetic elements 1/1' in a device such as MRAM. In addition, for a magnetic element 1 or 1' having a small enough size, the current required to switch the magnetization can be significantly less than the current required to generate a switching field in the conventional magnetic memory 10. Thus, there is less power consumption in writing.

Although the phenomenon of spin transfer can be used to switch the direction of the magnetization of the conventional free layer 8/8', one of ordinary skill in the art will readily recognize that there are additional barriers to using the conventional magnetic element 1/1' in a memory. For the conventional spin valve 1, the CPP configuration results in a significantly reduced signal. For example, the magnetoresistance ratio for the CPP configuration of the conventional spin valve 1 is only approximately two percent. In addition, the total resistance of the conventional spin valve 1 is low. Thus, the read signal output by the conventional spin valve 1 is very low. Although spin transfer can be used to write to a conventional spin valve 1, the output signal when reading from the conventional spin valve 1 is low enough to make it difficult to use the conventional spin valve 1 in a magnetic memory that is written using spin transfer.

On the other hand, a conventional spin tunneling junction 1' typically has a large resistance-area product, with Ra~k$\Omega \mu$m$^2$. A high current density used to induce the spin-transfer effect could destroy thin insulating barrier due to ohmic dissipation. Moreover, the spin transfer has not been observed in the conventional spin tunneling junction 1' at room temperature. The conventional spin tunneling junction 1' having high Ra values may, therefore, not be able to be used in MRAM using spin transfer to write to the magnetic memory cells. Consequently, one of ordinary skill in the art would recognize that a reliable, localized mechanism for writing to magnetic memories having higher densities and smaller magnetic elements is still desired.

The present invention provides a method and system for providing a magnetic element capable of being written using spin-transfer effect and a magnetic memory using the magnetic element. The magnetic element includes a spin tunneling junction and a spin valve, preferably separated by a separation layer. The spin tunneling junction includes a first free layer, a barrier layer and a first pinned layer. The first pinned layer is ferromagnetic and has a first pinned layer magnetization that is pinned in a first direction. The first free layer is ferromagnetic and has a first free layer magnetization. The barrier layer resides between the first pinned layer and the first free layer, is an insulator, and has a thickness that allows tunneling through the barrier layer. The spin valve has a second pinned layer, a nonmagnetic spacer layer and a second free layer. The second pinned layer is ferromagnetic and has a second pinned layer magnetization that is pinned in a second direction. The second free layer is ferromagnetic and has a second free layer magnetization. The nonmagnetic spacer layer is conductive and resides between the second free layer and the second pinned layer. The separation layer resides between the first free layer of the spin tunneling junction and the second free layer of the spin valve. The separation layer is configured to allow the first free layer and the second free layer to be magnetostatically coupled. In addition, the magnetic element is configured to allow the second free layer magnetization to change direction due to spin transfer when a write current is passed through the magnetic element in a CPP direction. Furthermore, the magnetic element can also be shaped to ensure that the spin valve has a smaller lateral dimension than the spin tunneling junction. This helps to ensure that a sufficiently high current density is provided to switch the direction of magnetization of the second free layer of the spin valve while reducing the probability that the barrier layer(s) of the spin tunneling junction are damaged.

The present invention will be described in terms of a particular magnetic memory and a particular magnetic element having certain components. However, one of ordinary skill in the art will readily recognize that this method and system will operate effectively for other magnetic memory elements having different and/or additional components and other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. For example, the present invention is described in terms of a top spin valve (having a pinned layer at the top of the spin valve) combined with a bottom spin tunneling junction (having a pinned layer at the bottom of the spin tunneling junction). The present invention is also consistent with a top tunneling junction and a bottom spin valve. In addition, the method and system are described in the context of certain layers being synthetic. However, one of ordinary skill in the art will readily recognize that other and/or additional layers, for example free layers, could be synthetic. Furthermore, the present invention is described in the context of certain features, such as shaping, magnetostatic coupling and a flux guide. However, one of ordinary skill in the art will readily recognize that the present invention is consistent with any combination of one or more of the above features. The present invention is also primarily disclosed in the context of a single spin valve and a single spin tunneling junction. However, one of ordinary skill in the art will readily recognize that the present invention is consistent with dual spin valves and/or dual spin tunneling junctions.

Figure 3:
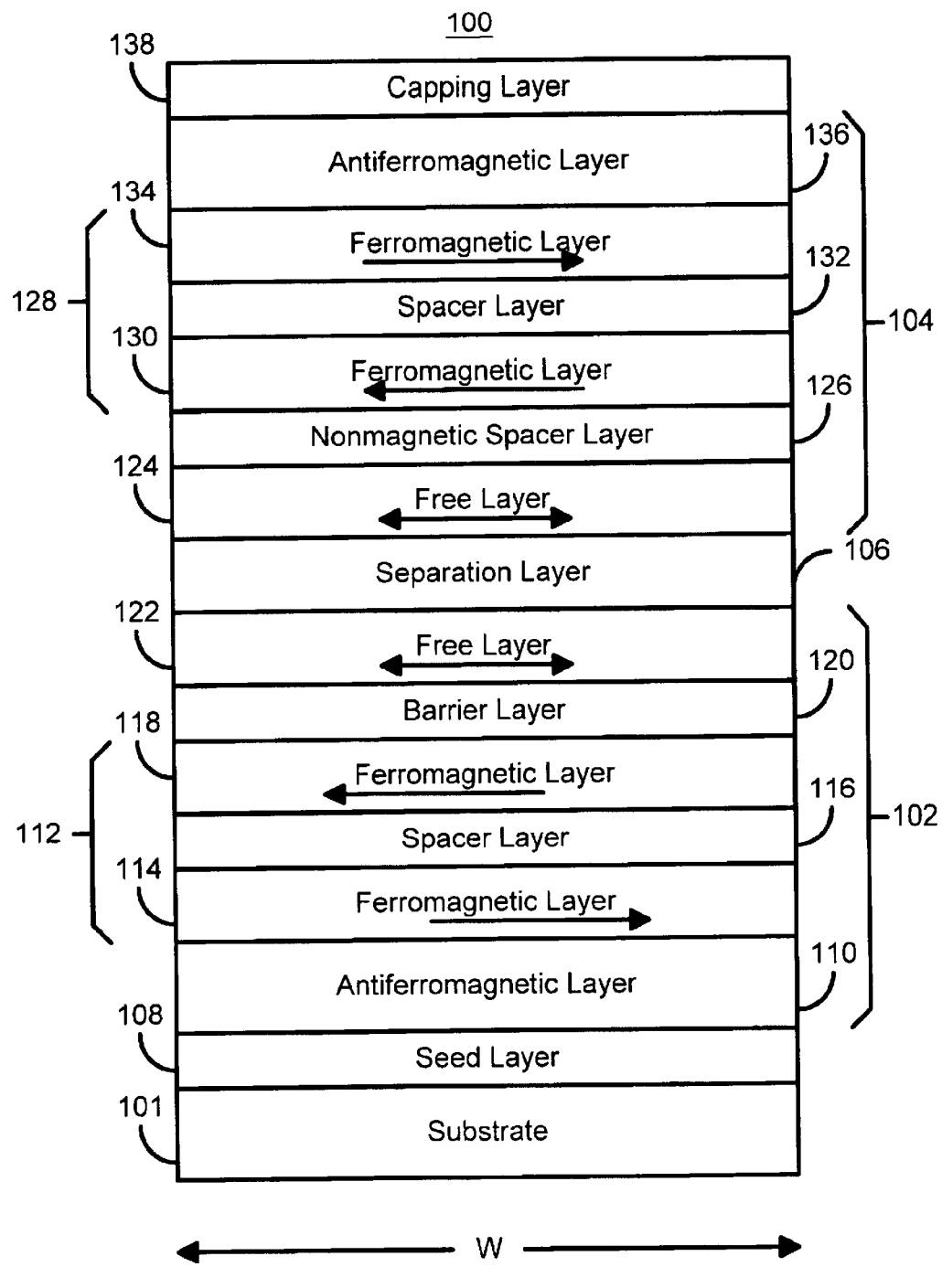
FIG. 3 is a diagram depicting one embodiment of a magnetic element in accordance with the present invention.

To more particularly illustrate the method and system in accordance with the present invention, refer now to FIG. 3, which depicts one embodiment of a magnetic element 100 in accordance with the present invention. Note that other layers may not be depicted for clarity. The magnetic element 100 includes a spin tunneling junction 102 and a spin valve 104 separated by a separation layer 106. The spin tunneling junction 102 is formed on a seed layer 108, which can reside on a substrate 101. The seed layer 108 is preferably Ta/NiFeCr, TaN/NiFeCr, or other material that contributes to a smooth crystalline film stack having a large grain size. The spin tunneling junction 102 includes a first antiferromagnetic (AFM) layer 110, a first pinned layer 112, a barrier layer 120, and a first free layer 122. The AFM layer 110 preferably includes PtMn, but may also include PdPtMn, NiMn, IrMn or other AFM materials. The first pinned layer 112 and first free layer 122 are ferromagnetic. The first free layer 122 may include Co, Fe, Ni or their alloys, such as CoFe, CoNi, CoFeNi and NiFe. Alternatively, the first free layer 122 may be synthetic. In addition, a small concentration of Cr, Cu, Pt and/or other nonmagnetic materials can be doped into the ferromagnetic materials for improving the thermal stability of the magnetic element 100 as well as for optimizing properties such as magnetostriction, magnetization and magnetic damping constants. The first pinned layer 112 is preferably a synthetic pinned layer including ferromagnetic layers 114 and 118 separated by a nonmagnetic layer 116. The nonmagnetic layer 116 is conductive and has a thickness that is sufficient to ensure that the ferromagnetic layers 114 and 118 are antiferromagnetically coupled. The ferromagnetic layers 114 and 118 preferably include Co, while the nonmagnetic layer preferably includes Ru. Although the first pinned layer 112 is depicted as being synthetic, the first pinned layer 112 may also be a simple, single constituent ferromagnetic layer made of materials similar to those used in the free layer 120. The first pinned layer 112 and first free layer 120 may also include half-metallic materials, such as $CrO_2$, $Sr_2FeMoO_6$, $(La_{0.7}Sr_{0.3})MnO_3$, and NiMnSb or laminated ferromagnetic and half-metallic layers. The first pinned layer 112 and the first free layer 120 may also include ferrimagnets, including but not limited to alloys of CoGd. Thus, as used herein, the term "ferromagnetic" includes, but is not limited to ferromagnets and ferrimagnets. The barrier layer 120 is an insulator, such as $Al_2O_3$, $ZrO_2$ and $HfO_2$, and is sufficiently thin to allow tunneling of charge carriers through the barrier layer 120.

The spin valve 104 includes a second free layer 124, a nonmagnetic spacer layer 126, a second pinned layer 128, and a second AFM layer 136. The second pinned layer 128 is preferably a synthetic pinned layer including ferromagnetic layers 130 and 134 separated by a nonmagnetic layer 130. The second AFM layer 136 preferably includes PtMn, but may also include PdPtMn, NiMn, IrMn or other AFM materials. The second pinned layer 128 and second free layer 124 are ferromagnetic. The second free layer 124 may include Co, Fe, Ni or their alloys, such as CoFe, CoNi, CoFeNi and NiFe. Alternatively, the second free layer 124 may be synthetic. In addition, a small concentration of Cr, Cu, Pt and/or other nonmagnetic materials can be doped into the ferromagnetic materials for improving the thermal stability of the magnetic element 100 as well as for optimizing properties such as magnetostriction ($\lambda$), saturation magnetization ($M_s$), bulk spin asymmetry coefficient ($\beta$) and magnetic damping constants ($\alpha$). The second pinned layer 128 is preferably a synthetic pinned layer including ferromagnetic layers 130 and 134 separated by a nonmagnetic layer 132. The nonmagnetic layer 132 is conductive and has a thickness that is sufficient to ensure that the ferromagnetic layers 130 and 134 are antiferromagnetically coupled. The ferromagnetic layers 130 and 134 preferably include Co, while the nonmagnetic layer 132 preferably includes Ru. Although the second pinned layer 128 is depicted as being synthetic, the second pinned layer 128 may also be a simple, single constituent ferromagnetic layer made of materials similar to those used in the second free layer 124. The second pinned layer 128 and second free layer 124 may also include half-metallic materials, such as $CrO_2$, $Sr_2FeMoO_6$, $(La_{0.7}Sr_{0.3})MnO_3$, and NiMnSb or laminated ferromagnetic and half-metallic layers. The second pinned layer 128 and the second free layer 124 may also include ferrimagnets, including but not limited to alloys of CoGd. In the preferred embodiment, the second free layer 124 of the spin valve 104 is written to using spin transfer, while the spin tunneling junction 102 of the magnetic element 100 is used to read the magnetic element 100.

The magnetic element 100 is configured to allow the magnetization of the second free layer 124 to be switched using spin transfer. Consequently, the dimensions of the magnetic element 100 are small, in the range of few hundred nanometers. In a preferred embodiment, the dimensions of the magnetic element 100 are less than two hundred nanometers and preferably approximately one hundred nanometers. The magnetic element 100 preferably has a depth, perpendicular to the plane of the page in FIG. 3, of approximately fifty nanometers. The depth is preferably smaller than the width of the magnetic element 100 so that the magnetic element 100 has some shape anisotropy, ensuring that the second free layer 124 has a preferred direction. In addition, the thickness of the second free layer 124 is small enough that the spin transfer is strong enough to rotate the free layer magnetization into and out of alignment with the magnetization of the second pinned layer 128. In a preferred embodiment, the second free layer 124 has a thickness of less than five nm.

The separation layer 106 is preferably a nonmagnetic conductive layer. Thus, the separation layer 106 can include materials such as Cu, Au or Ag. The separation layer is thick enough to preclude interlayer exchange coupling of the free layers 122 and 124. This thickness is preferably at least one hundred to two hundred Angstroms. The separation layer 106 also preferably substantially reduces or eliminates the spin transfer due to electrons reflected from the interface of the separation layer 106 and the free layer 122 or 124. In order to do so, materials having a short spin diffusion length are preferably used or inserted into the separation layer 106. For example, the separation layer 106 could be composed of a material such as CuPt or CuMn. Alternatively, the separation layer 106 could be a multilayer including one or more layers of material such as CuPt or CuMn. For example, the separation layer 106 could include a trilayer composed of a layer of CuPt sandwiched between two Cu layers. The separation layer 106 could also include Pt, Mn, a Cu/CuPt sandwich and/or a CuMn/Cu sandwich. Furthermore, the separation layer 106 has a thickness that allows for magnetostatic coupling between the first free layer 122 and the second free layer 124. In a preferred embodiment, the first free layer 122 and the second free layer 124 are magnetostatically coupled to be antiparallel, as shown in FIG. 3. For example, when the magnetic element 100 is an ellipsoid of $0.1 \times 0.2 \, \mu m^2$ the first free layer 122 and the second free layer 124 are magnetostatically coupled due to edge magnetic poles and are, therefore, antiparallel. However, in an alternate embodiment, the directions of the magnetizations of the free layers 122 and 124 could be coupled in another direction with respect to each other.

Also in a preferred embodiment, the geometry of the layers of the magnetic element is tailored to reduce the magnetic interactions from ferromagnetic layers 114, 118, 130 and 132 other than the free layers 122 and 124 on the free layers 122 and 124. For example, assume that the magnetic element 100 has a width, w, and a depth (out of the page) d, and that the free layers 122 and 124 have thicknesses $t_1$ and $t_2$, respectively. Also assume that the magnetizations of the first free layer 122 and the second free layer 124 are $M_1$ and $M_2$, respectively. The thicknesses of the ferromagnetic layers 114, 118, 130 and 132, the nonmagnetic spacer layer 126, and the barrier layer 120 are elected to balance the interaction and demagnetization fields of the ferromagnetic layers 114, 118, 130 and 132 so that the free layers 122 and 124 do not experience a strong net bias from the ferromagnetic layers 114, 118, 130 and 132. In other words, the total of the magnetostatic field and the interlayer and static coupling fields from layers other than the free layers 122 and 124 preferably sum to zero to reduce the bias on the free layers 122 and 124. In addition, the geometry of the free layers 122 and 124 is tailored to ensure that the first free layer 122 switched to remain antiparallel to the second free layer 124 when the second free layer 124 is switched using spin transfer. In order to do so, the dipolar field of $8M_2t_2/w$ from the second free layer 124 to the first free layer 122 must be larger than the coercive field required to reverse the magnetization of the first free layer 122 during switching of the second free layer 124. This condition can be achieved by choosing the appropriate materials and thicknesses of the free layers 122 and 124. Thus, high moment (product of magnetization and thickness) films including but not limited to Co or CoFe layers with larger thicknesses, for example between twenty and fifty Angstroms, are preferred for the second free layer 124. Lower moment films including but not limited to NiFe, CoFe/NiFe, and CoFeNi layers with smaller thicknesses, for example between five and twenty Angstroms, are preferred for the first free layer 122.

In operation, the magnetic element 100 is written by driving current in a CPP configuration and exploiting spin transfer. Currently, the spin transfer phenomenon is predominantly provided using the spin valve portion 104 of the magnetic element 100. In particular, a current can be driven from the spin tunneling junction 102 through the spin valve 104. Electrons, therefore, travel down from the spin valve 104 through the spin tunneling junction 102. This current corresponds to electrons spin polarized in the direction of magnetization of the ferromagnetic layer 130 of second pinned layer 128. The electrons from the ferromagnetic layer 130 can transfer a portion of their angular momentum to the second free layer 124. The electrons can thus set the magnetization of the second free layer 124 in the same direction as the magnetization of the ferromagnetic layer 130. Note that in one embodiment, electrons reflected from the first free layer 122 do not contribute to the spin transfer effect because the separation layer 106 reduces or eliminates the spin transfer effect due to electrons reflected from the interface of the separation layer 106 and the free layers 122 and 124. Thus, when current is driven in a direction from the spin tunneling junction 102 to the spin valve 104, the direction of magnetization of the second free layer 124 is switched to be parallel to the magnetization of the ferromagnetic layer 130.

For the case in which the current is driven in the opposite direction, the magnetization of the second free layer 124 is assumed to be initially parallel to the magnetization of the ferromagnetic layer 130. Current is driven from the spin valve 104 to the spin tunneling junction 102, with electrons traveling in the opposite direction. In a preferred embodiment, electrons from the first free layer 122 do not contribute to the spin transfer because of the separation layer 106. Majority electrons leaving the second free layer 124 have their spins polarized parallel to the magnetization of the second free layer 124. These electrons have their spins polarized parallel to the ferromagnetic layer 130 and are thus transmitted by the ferromagnetic layer 130. The minority electrons have their spins polarized antiparallel to the magnetizations of the second free layer 124 and the ferromagnetic layer 130. Minority electrons are thus reflected by the ferromagnetic layer 130. Minority electrons reflecting off of the ferromagnetic layer 130 of the second pinned layer 128 and returning to the second free layer 124 can transfer a portion of their angular momentum to the second free layer 124. Thus, the minority electrons reflecting from the ferromagnetic layer 130 can switch the magnetization of the second free layer 124 to be antiparallel to the magnetization of the ferromagnetic layer 130.

During reading, the properties of the spin tunneling junction 102 and the magnetostatic coupling between the free layers 122 and 124 are exploited. Because of the insulating barrier 120, the resistance of the spin tunneling junction 102 is large. Thus, the spin tunneling junction 102 dominates the output signal. Because of the magnetostatic coupling between the free layers 122 and 124, the magnetization of the free layer 122 of the spin tunneling junction 102 is related to the direction of magnetization of the second free layer 124 of the spin valve 104. In particular, a change in direction of the magnetization of the second free layer 124 causes a change in the direction of magnetization of the first free layer 122 because of the magnetostatic coupling between the free layers 122 and 124. For example, assuming that the magnetic element 100 is written by driving current from the spin tunneling junction 102 to spin valve 104, the magnetization of the second free layer 124 is written to be parallel to the ferromagnetic layer 130. Because of the magnetostatic coupling between the free layers 122 and 124, the direction of magnetization of the first free layer 122 also switches. In the embodiment depicted in FIG. 3, the magnetization of the first free layer 122 will switch to be antiparallel to the magnetizations of the ferromagnetic layer 130 and the second free layer 124. Similarly, switching the magnetization of the second free layer 124 to be antiparallel to the magnetization of the ferromagnetic 130 will cause the magnetization of the first free layer 122 to be parallel to the magnetizations of the ferromagnetic 130 and the second free layer 124.

Depending upon the direction of the magnetization of the first free layer 122, the resistance of the spin tunneling junction 102 will be either low (first free layer 122 magnetization parallel to ferromagnetic layer 118 magnetization) or high (first free layer 122 magnetization antiparallel to ferromagnetic layer 118 magnetization). As stated above, because of its high resistance, the spin tunneling junction 102 dominates the signal of the to magnetic element 100. By driving a read current in a CPP configuration, the resistance state of the spin tunneling junction 102 can be determined. Note, however, that the read current is substantially less than the current used to write to the spin valve 104 in order to prevent inadvertent writing of the magnetic element 100. In a preferred embodiment, the read current is an order of magnitude less than the write current.

Consequently, spin transfer can be used to write to magnetic element 100. As a result, a switching field driven by an external current is unnecessary. Instead, a more localized and reliable phenomenon is used to write to the spin valve 104 of the magnetic element 100. Furthermore, because of the magnetostatic coupling between the free layers 122 and 124, writing to the second free layer 124 of the spin valve 104 causes a change in the magnetization direction of the first free layer 122 of the spin tunneling junction 102. As a result, the spin tunneling junction 102 can be used to read the data that has been written to the spin valve 104 of the magnetic element. Consequently, a higher output signal is achieved.

Furthermore, use of the spin tunneling junction 102 and the spin valve 104 having separate free layers 122 and 124, respectively, provides additional benefits. Because the second free layer 124, which is written to, is separate from the first free layer 122, which is read from, the properties of the free layers 122 and 124 can be independently optimized. In particular, the coercivity of the first free layers 122 can be made low to ensure that the magnetization of the first free layer 122 follows the magnetization of the second free layer 124. In contrast, the coercivity of the second free layer 124 can be made high to ensure that the second free layer 124 is not inadvertently written to during reading. The characteristics of the second free layer 124 can also be tailored to improve the spin transfer or to otherwise improve performance of the spin valve 104. The characteristics of the first free layer 122 can also be tailored to improve the signal by improving the magnetoresistance ratio or otherwise improve the performance of the spin tunneling junction 102. In addition, the materials and thicknesses of the free layers 122 and 124 can be selected as described above. Thus, because of the use of separate free layers 122 and 124 for the spin tunneling junction 102 and spin valve 104, respectively, the properties of the spin tunneling junction 102 and spin valve 104 can be separately tailored for their functions. As a result, performance of the magnetic element 100 is improved.

Figure 4:
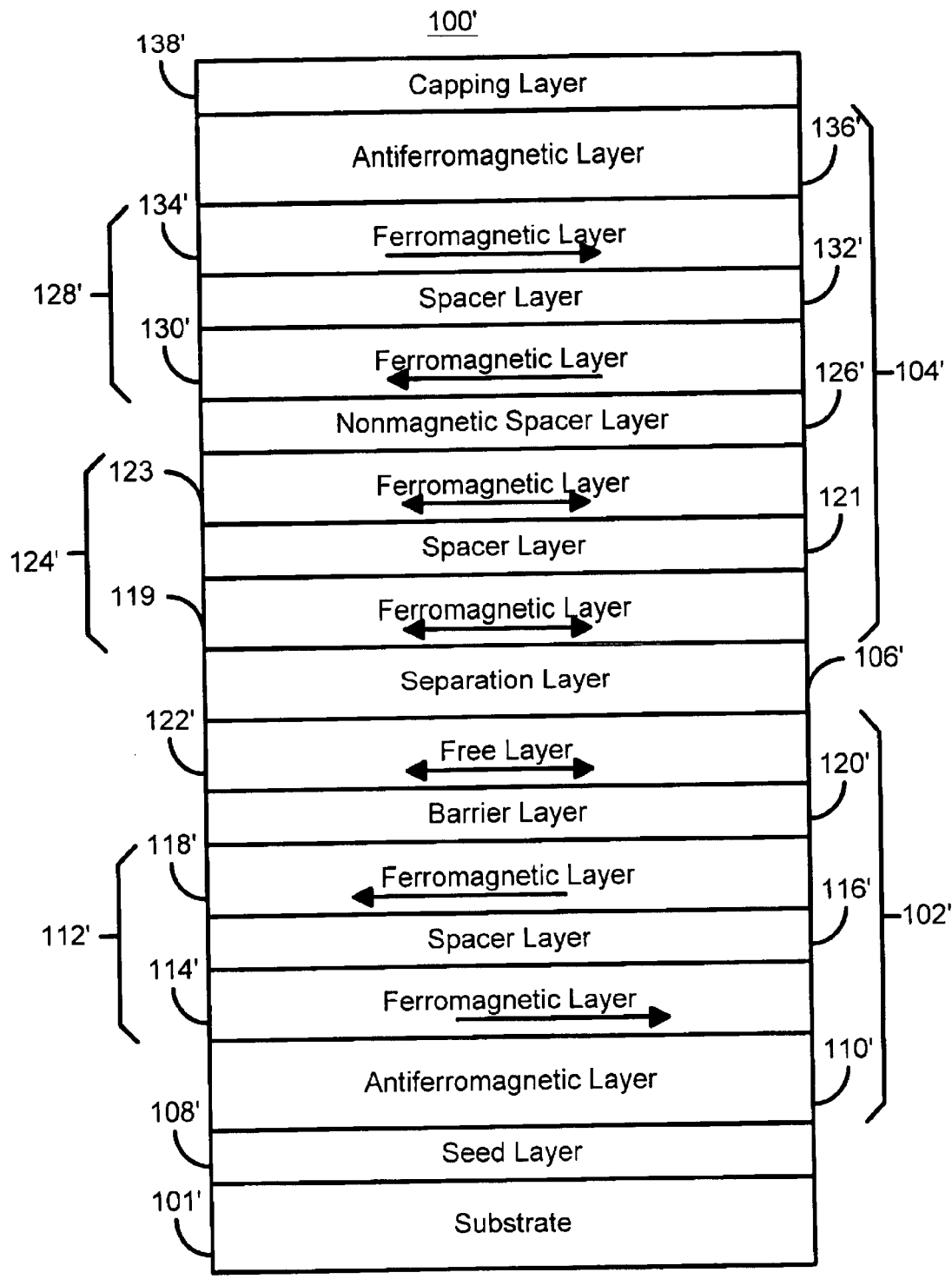
FIG. 4 is a diagram depicting a second embodiment of a magnetic element in accordance with the present invention.

FIG. 4 is a diagram depicting a second embodiment of a magnetic element 100' in accordance with the present invention. The magnetic element 100' has many of the same components as the magnetic element 100 depicted in FIG. 3. Consequently, analogous structures are labeled similarly for the magnetic element 100' depicted in FIG. 4. In addition, these components are preferably fabricated in an analogous manner and made from similar materials as analogous components in the magnetic element 100. However, the second free layer 124' is synthetic. Thus, the second free layer 124' includes ferromagnetic layers 119 and 123 which are separated by a nonmagnetic layer 121, which is preferably composed of Ru. When the second free layer 124' is synthetic, the giant magnetoresistance of the spin valve 104 is added to the magnetoresistance of the spin tunneling junction 102 during reading. As a result, in addition to the benefits achieved by the magnetic element 100, the read signal is increased.

Figure 5:
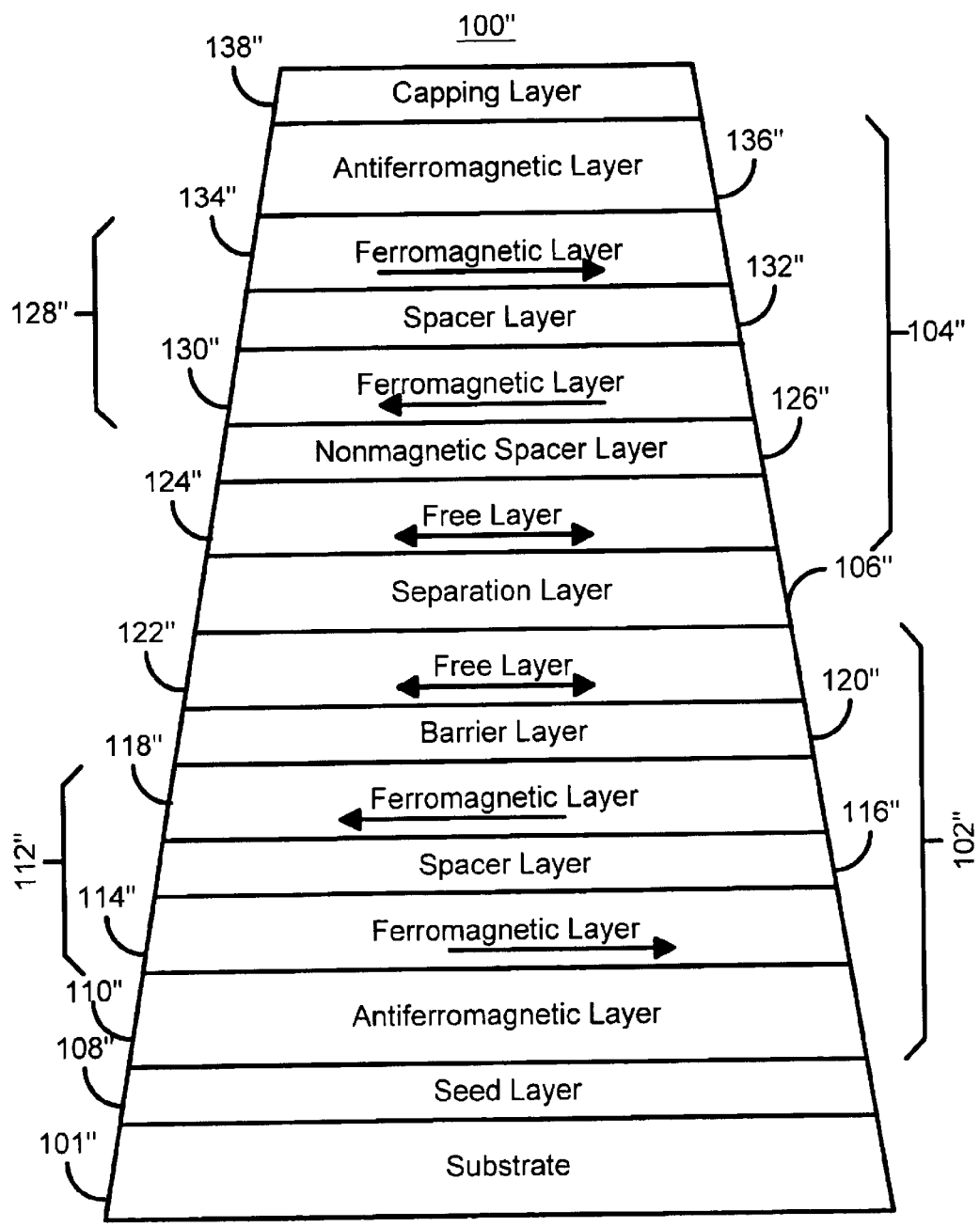
FIG. 5 is a diagram depicting a third embodiment of a magnetic element in accordance with the present invention that incorporates shaping of the magnetic element.

FIG. 5 is a diagram depicting a third embodiment of a magnetic element 100" in accordance with the present invention that incorporates shaping of the magnetic element. The magnetic element 100" has many of the same components as the magnetic element 100 depicted in FIG. 3. Consequently, analogous structures are labeled similarly for the magnetic element 100" depicted in FIG. 5. In addition, although the pinned layers 112" and 128" are depicted as synthetic, nothing prevents the pinned layers 112" and 128" from being simple ferromagnetic layers. Similarly, although the free layers 122" and 124" are depicted as simple ferromagnetic layers, nothing prevents the free layers 122" and 124" from being synthetic. As mentioned above, a sufficiently high current density of greater than or equal to approximately $10^7$ Amps/cm$^2$ is generally require to employ spin transfer to write to the spin valve 104 of the magnetic element 100 depicted in FIG. 3. However, such a high current density may adversely affect the spin tunneling junction 102. In particular, the barrier layer 120 has a voltage limit, which corresponds to a current density limit. Above this voltage limit, or current density limit, the barrier layer 120 can undergo breakdown.

Referring back to FIG. 5, the magnetic element 100" is shaped to help ensure that the current density in the spin tunneling junction 102" is not high enough to cause the barrier layer 120" to break down, while retaining a sufficiently high current density to switch the magnetization of the free layer 124" using spin transfer. Shaping the magnetic element 100" ensures that the cross sectional area for the spin tunneling junction 102 is larger than the cross sectional area for the spin valve 104. For example, assume that the spin valve has a first width, a first depth, and a first dimension that is the first width multiplied by the first depth. Also assume that the spin tunneling junction has a second width, a second depth, and a second dimension that is the second width multiplied by the second depth. In such a case, shaping the magnetic element would preferably include ensuring that a first dimension of the spin valve is less than a second dimension of the spin tunneling junction. In the embodiment shown in FIG. 5, to ensure that the spin valve 104" has a higher current density, the magnetic element 100" has a trapezoidal shape. The spin tunneling junction 102" resides at the bottom of the trapezoid, where the magnetic element 100" is wider and thus has a larger cross section. The spin valve 104" resides at the top of the trapezoid, where the magnetic element 100" is narrower and thus has a smaller cross section. As a result, for a particular current driven through the magnetic element 100" in the CPP configuration, the current density in the spin tunneling junction 102" is lower than the current density in the spin valve 104". Thus, spin transfer can be used for writing to the second free layer 124", while reducing the probability that the barrier layer 120" undergoes breakdown.

Figure 6:
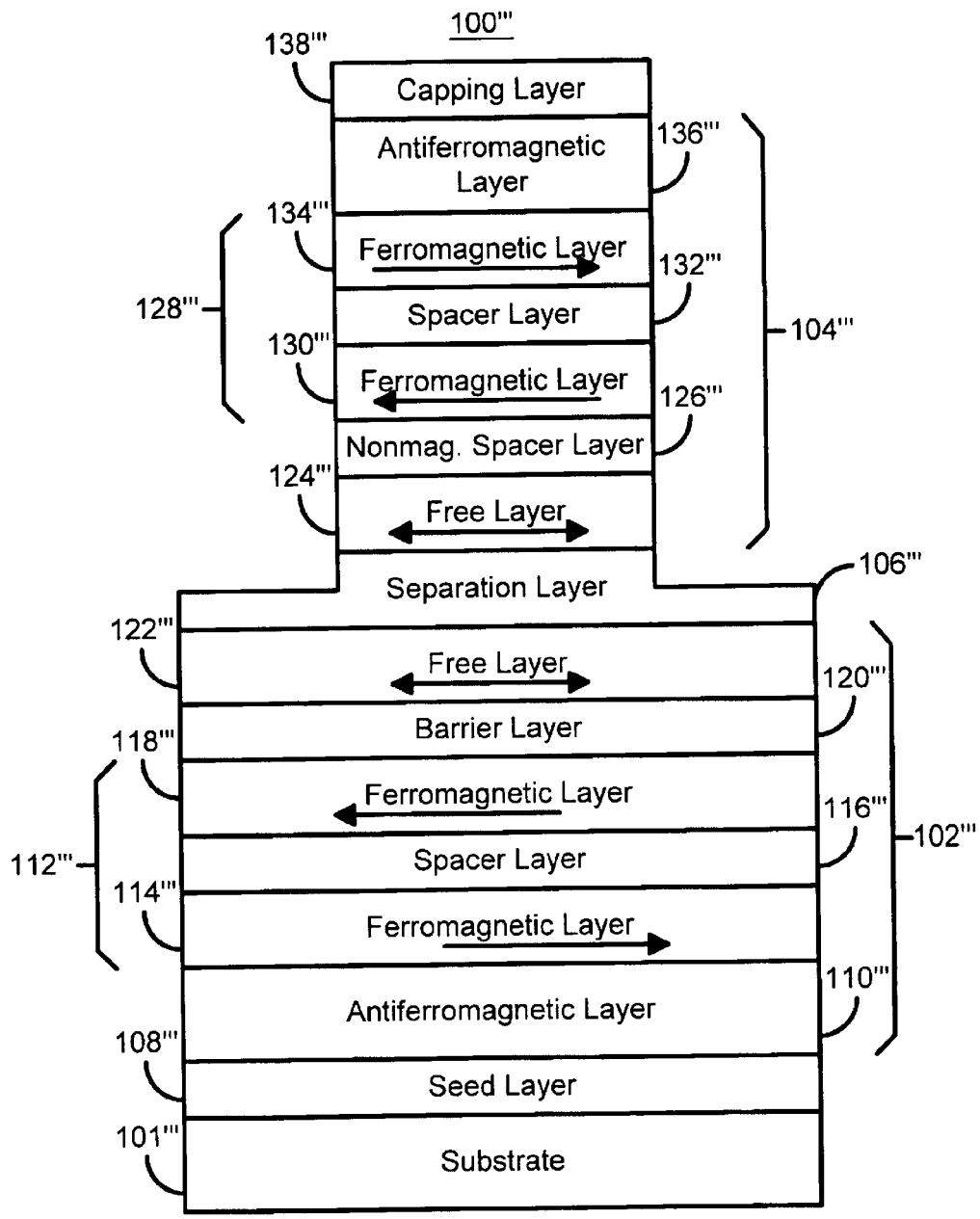
FIG. 6 is a diagram depicting a fourth embodiment of a magnetic element in accordance with the present invention that incorporates shaping of the magnetic element.

FIG. 6 is a diagram depicting a fourth, preferred embodiment of a magnetic element 100''' in accordance with the present invention that incorporates shaping of the magnetic element 100'''. The magnetic element 100''' has many of the same components as the magnetic element 100" depicted in FIG. 6. Consequently, analogous structures are labeled similarly for the magnetic element 100" depicted in FIG. 6. In addition, although the pinned layers 112''' and 128''' are depicted as synthetic, nothing prevents the pinned layers 112''' and 128''' from being simple ferromagnetic layers. Similarly, although the free-layers 122''' and 124''' are depicted as simple ferromagnetic layers, nothing prevents the free layers 122''' and 124''' from being synthetic. The magnetic element 100''' is also shaped to help ensure that the current density in the spin tunneling junction 102''' is not high enough to cause the barrier layer 120''' to break down, while retaining a sufficiently high current density to switch the magnetization of the free layer 124''' using spin transfer. In order to do so, the magnetic element 100''' has an inverse T-shape. The spin tunneling junction 102''' resides at the base of the inverse T, where the magnetic element 100''' is wider and thus has a larger cross section. For example, in one embodiment, the base portion may be a 0.1×0.2 $\mu m_2$ ellipsoid. The spin valve 104''' resides at the vertical portion of the inverse T, where the magnetic element 100''' is narrower and thus has a smaller cross section. For example, in one embodiment, the vertical portion may be a 0.05×0.1 $\mu m_2$ ellipsoid. As a result, for a particular current driven through the magnetic element 100''' in the CPP configuration, the current density in the spin tunneling junction 102''' is lower than the current density in the spin valve 104'''. Thus, spin transfer can be used for writing to the second free layer 124''', while reducing the probability that the barrier layer 120''' undergoes breakdown. Thus, in addition to the benefits mentioned above, shaping the magnetic element can improve the reliability of the magnetic element 100'''.

Figure 7:
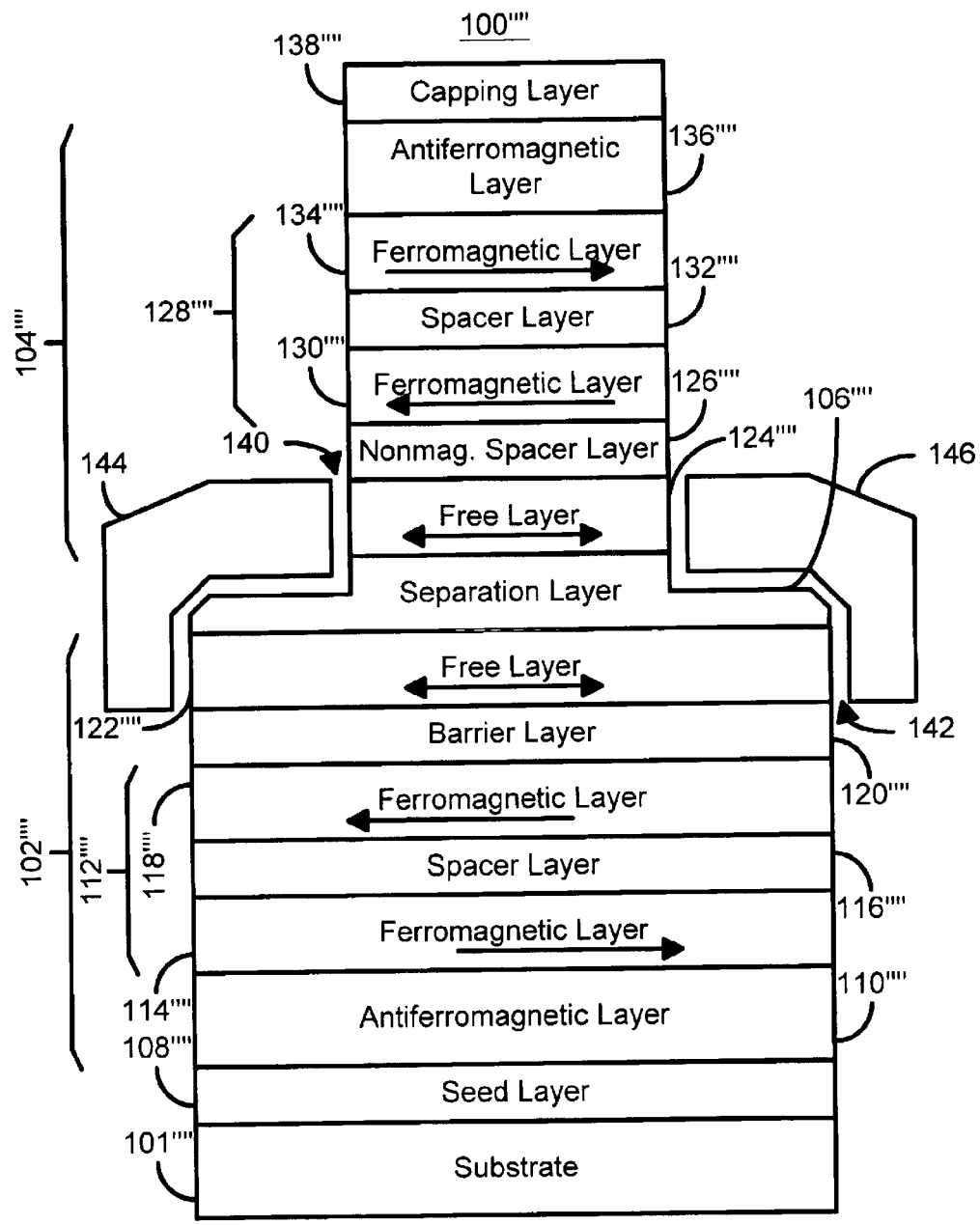
FIG. 7 is a diagram depicting a fifth embodiment of a magnetic element in accordance with the present invention that incorporates a flux guide.

FIG. 7 is a diagram depicting a fifth embodiment of a magnetic element 100'''' in accordance with the present invention that incorporates a flux guide. The magnetic element 100'''' has many of the same components as the magnetic element 100 depicted in FIG. 3. Consequently, analogous structures are labeled similarly for the magnetic element 100'''' depicted in FIG. 7. In addition, although the pinned layers 112'''' and 128'''' are depicted as synthetic, nothing prevents the pinned layers 112'''' and 128'''' from being simple ferromagnetic layers. Similarly, although the free layers 122'''' and 124'''' are depicted as simple ferromagnetic layers, nothing prevents the free layers 122'''' and 124'''' from being synthetic. Furthermore, although the magnetic element 100'''' is depicted as having an inverse T-shape, nothing precludes the magnetic element 100'''' from having another shape. Finally, although only the magnetic element 100'''' is depicted as incorporating a flux guide, the flux guide could be incorporated other embodiments of the magnetic element in accordance with the present invention.

The magnetic element 100'''' also includes a flux guide 144 and 146. The flux guide 144, 146 is separated from the magnetic element 100'''' by an insulating layer 140, 142, respectively. The flux guide 144, 146 is preferably formed from soft magnetic material such as NiFe. The flux guide 144, 146 is added at the ends of the long axis of the magnetic element 100''''. The flux guide 144, 146 terminates at the edges of the first free layer 122'''' and the second free layer 124''''. As a result, the flux from the second free layer 124'''' is more efficiently provided to the first free layer 122'''', and vice versa. This allows for a stronger magnetostatic coupling between the free layers 122'''' and 124''''. Consequently, reliability of the magnetic element 100 is improved.

Figure 8:
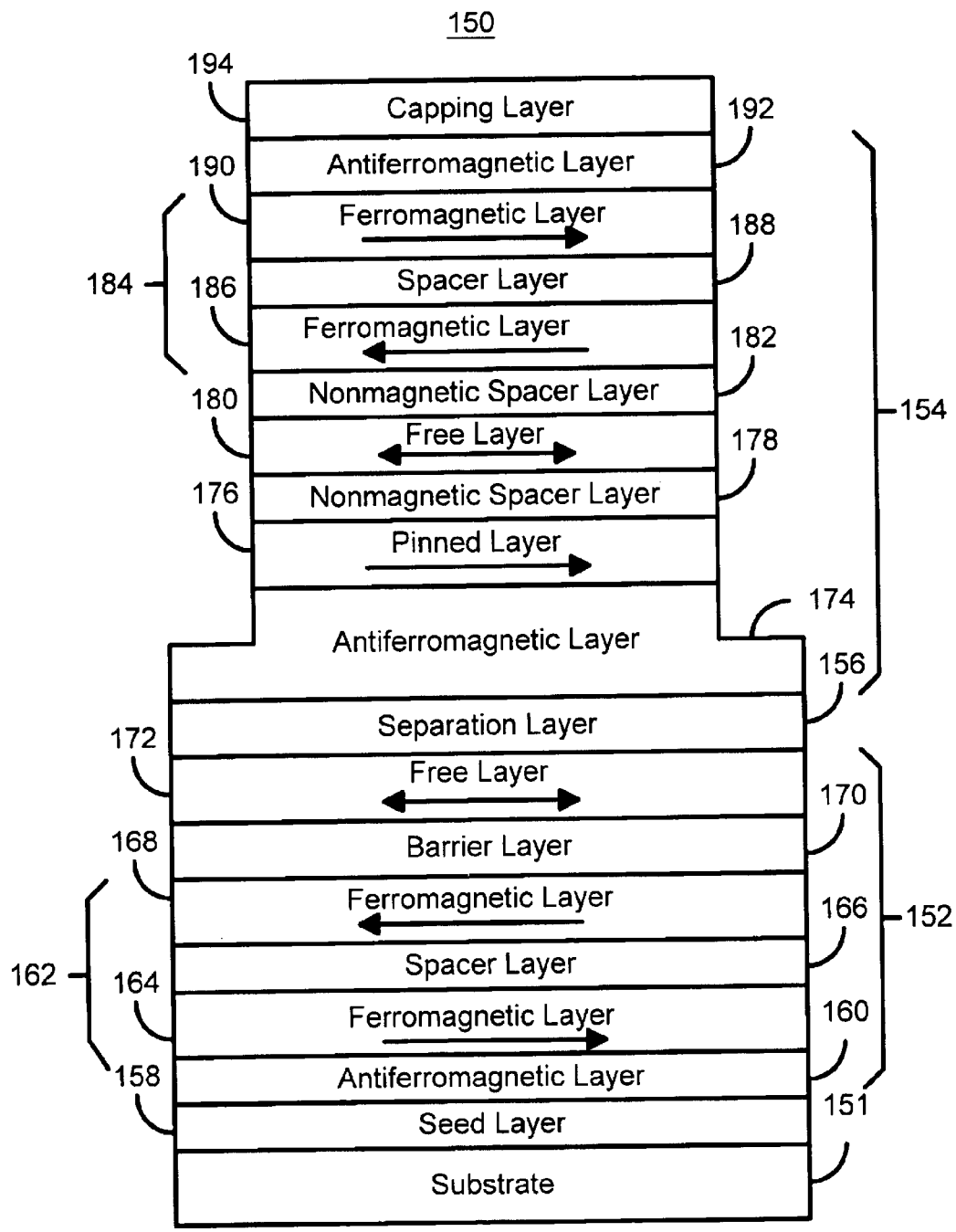
FIG. 8 is a diagram depicting a sixth embodiment of a magnetic element in accordance with the present invention that incorporates a dual spin valve.

FIG. 8 is a diagram depicting a sixth, preferred embodiment of a magnetic element 150 in accordance with the present invention that incorporates a dual spin valve. Although the magnetic element 150 is depicted as having an inverse T-shape, the magnetic element 150 need not be shaped or may have a different shape such as a trapezoidal shape. The magnetic element 150 includes a spin tunneling junction 152 and a dual spin valve 154 separated by a separation layer 156. The spin tunneling junction 152 resides on a substrate 151. The spin tunneling junction 152 includes an AFM layer 160, first pinned layer 162, a barrier layer 170, and a free layer 172. The first pinned layer 162 includes two ferromagnetic layers 164 and 168 separated by a spacer layer 166. However, in another embodiment, the first pinned layer 162 could be a simple pinned layer. The spacer layer 166 is a nonmagnetic conductive layer having a thickness sufficient to ensure that the ferromagnetic layers 164 and 168 are antiferromagnetically coupled. The spin valve 154 includes a first AFM layer 174, a second pinned layer 176, a first nonmagnetic spacer layer 178, a free layer 180, a second nonmagnetic spacer layer 182, a third pinned layer 184, and a second AFM layer 192. Also depicted is a capping layer 194. The pinned layers 176 and 184 are simple and synthetic pinned layers, respectively. However, nothing prevents the pinned layers 176 and 184 from being synthetic and simple pinned layers, respectively. The third pinned layer 184 includes ferromagnetic layers 186 and 190 that are antiferromagnetically coupled and separated by a spacer layer 188. The free layers 172 and 180 are magnetostatically coupled, preferably so that they are antiferromagnetically aligned.

The magnetic element 150 functions in essentially the same manner as the magnetic elements 100, 100', 100", 100''', and 100''''. However, the magnetic element 150 can also be written to using a smaller write current. The second and third pinned layers 176 and 184 are oriented in opposite directions. Consequently, when writing using spin transfer, the effect of the majority charge carriers from the second pinned layer 176 and minority carriers reflected from the third pinned layer 184 are additive. Similarly, the effect of the majority charge carriers from the third pinned layer 184 and minority carriers reflected from the second pinned layer 176 are additive. Because the effects of the charge carriers are additive, a lower write current can be used to write to the magnetic element 150. There is, therefore, a lower probability that the spin tunneling junction 152 will undergo failure due to breakdown of the dielectric layer 170. Consequently, in addition to having the improved performance and reliability associated with the magnetic elements 100, 100', 100", 100''' and 100'''', the magnetic element 150 has improved reliability due to the use of a lower write current.

Figure 9:
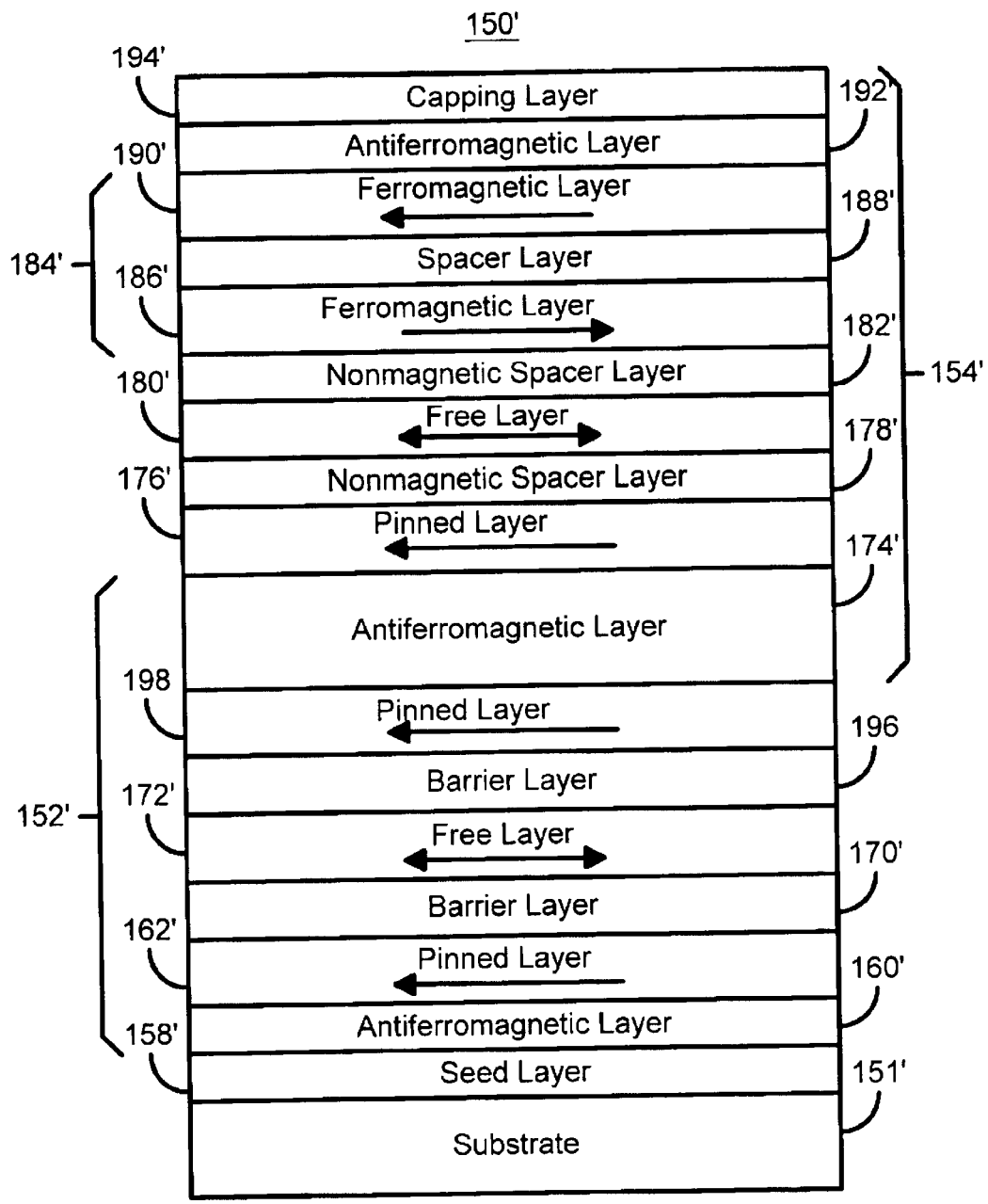
FIG. 9 is a diagram depicting a seventh embodiment of a magnetic element in accordance with the present invention that incorporates a dual tunneling magnetic junction.

FIG. 9 is a diagram depicting a seventh embodiment of a magnetic element 150' in accordance with the present invention that incorporates a dual tunneling magnetic junction 152' in addition to a dual spin valve 154'. Although the magnetic element 150' is not depicted as being shaped, for example into a trapezoid or an inverse T, nothing prevents the magnetic element 150' from being so shaped. The magnetic element 150' has many of the same components as the magnetic element 150 depicted in FIG. 8. Consequently, analogous structures are labeled similarly for the magnetic element 150' depicted in FIG. 9. In addition, the magnetic element 150' includes a dual spin tunneling junction 152'. Thus, the spin tunneling junction 152' includes a second barrier layer 196 and a second pinned layer 198. Although the pinned layers 162', 176', and 198' are depicted as being simple pinned layers, nothing prevents the pinned layers 162', 176', and 198' from being synthetic pinned layers.

The magnetic element 150' functions in essentially the same manner as the magnetic element 150. Note, however, that the magnetic element 150' does not include a separation layer. Instead, the AFM antiferromagnetic layer 174' is used to pin the magnetization of both pinned layers 176' and 198. However, the first free layer 172' and the second free layer 180' are still magnetostatically coupled. In addition, the first free layer 172' and the second free layer 180' are preferably separated by a distance that allows the free layers 172' and 180' to be magnetostatically coupled such that they are antiferromagnetically aligned. However, another embodiment of a magnetic element (not shown) incorporating dual spin tunneling junction and a dual spin valve may include separate AFM layers and a separation layer. Because the spin tunneling junction 152' is a dual spin tunneling junction, the magnetic element 150' has a higher signal during reading and smaller tunneling magnetoresistance reduction due to non-zero bias voltage. Consequently, performance of the magnetic element 150' is improved.

Figure 10:
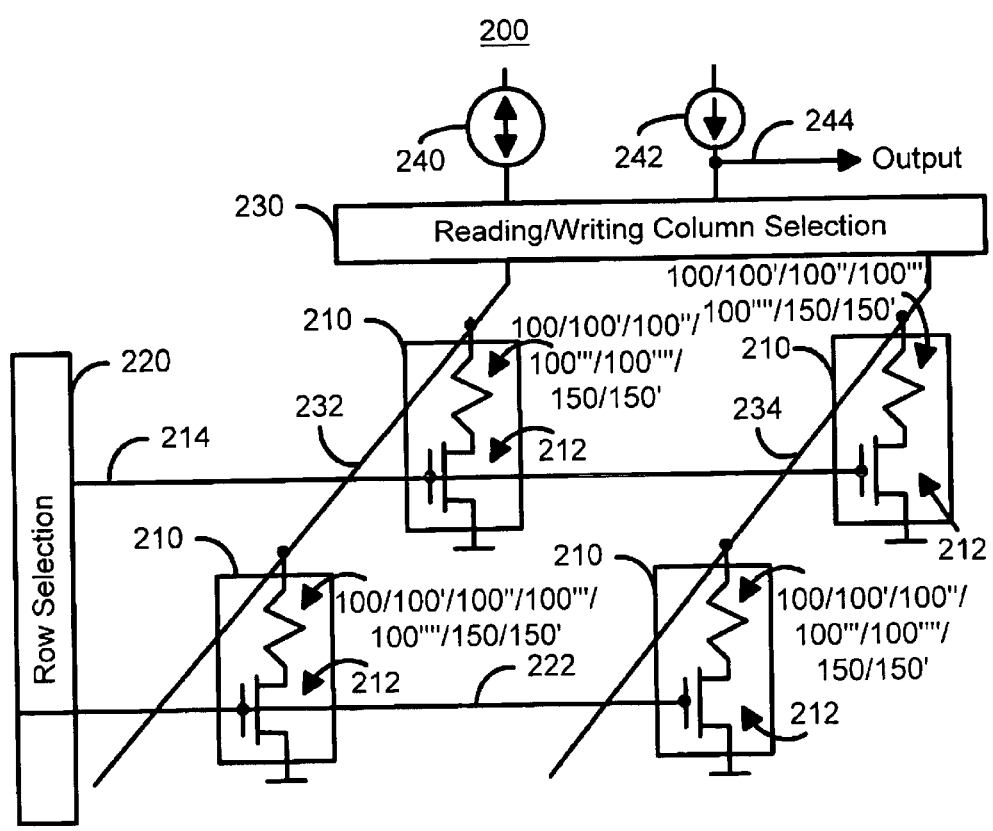
FIG. 10 is a diagram depicting one embodiment of a magnetic memory in accordance with the present invention using the magnetic element in accordance with the present invention.

FIG. 10 is a diagram depicting one embodiment of a magnetic memory 200 in accordance with the present invention using the magnetic elements 100, 100', 100", 100''', 100'''', 150, and/or 150' in accordance with the present invention. The magnetic memory array 200 is for exemplary purposes only and thus depicts a memory array 200 in which the magnetic elements 100, 100', 100", 100''', 100'''', 150, and/or 150' may be more directly incorporated into a conventional memory. Thus, each memory cell 210 includes a magnetic element 100, 100', 100", 100''', 100'''', 150, and/or 150' and a transistor 212. The magnetic memory array 200 also includes row selection mechanism 220, column selection mechanism 230, word lines 222 and 214, and bit lines 232 and 234. The magnetic memory array 200 further includes write current source 240 and read current source 242. However, the magnetic memory array 200 does not include any write lines.

Because spin transfer is used to write to the magnetic elements 100, 100', 100", 100''', 100'''', 150, and/or 150', additional lines, such as write lines 60 and 62 of the conventional memory 10, depicted in FIG. 2, are unnecessary. Consequently, the density of the magnetic memory 200 may be further increased without high power consumption and other issues due to the use of the conventional write operation to write the conventional. memory elements 1 and 1'. In addition, the circuitry used to write to the magnetic elements 100, 100', 100", 100''', 100'''', 150, and/or 150' can be simplified because of the omission of separate write lines.

Figure 11:
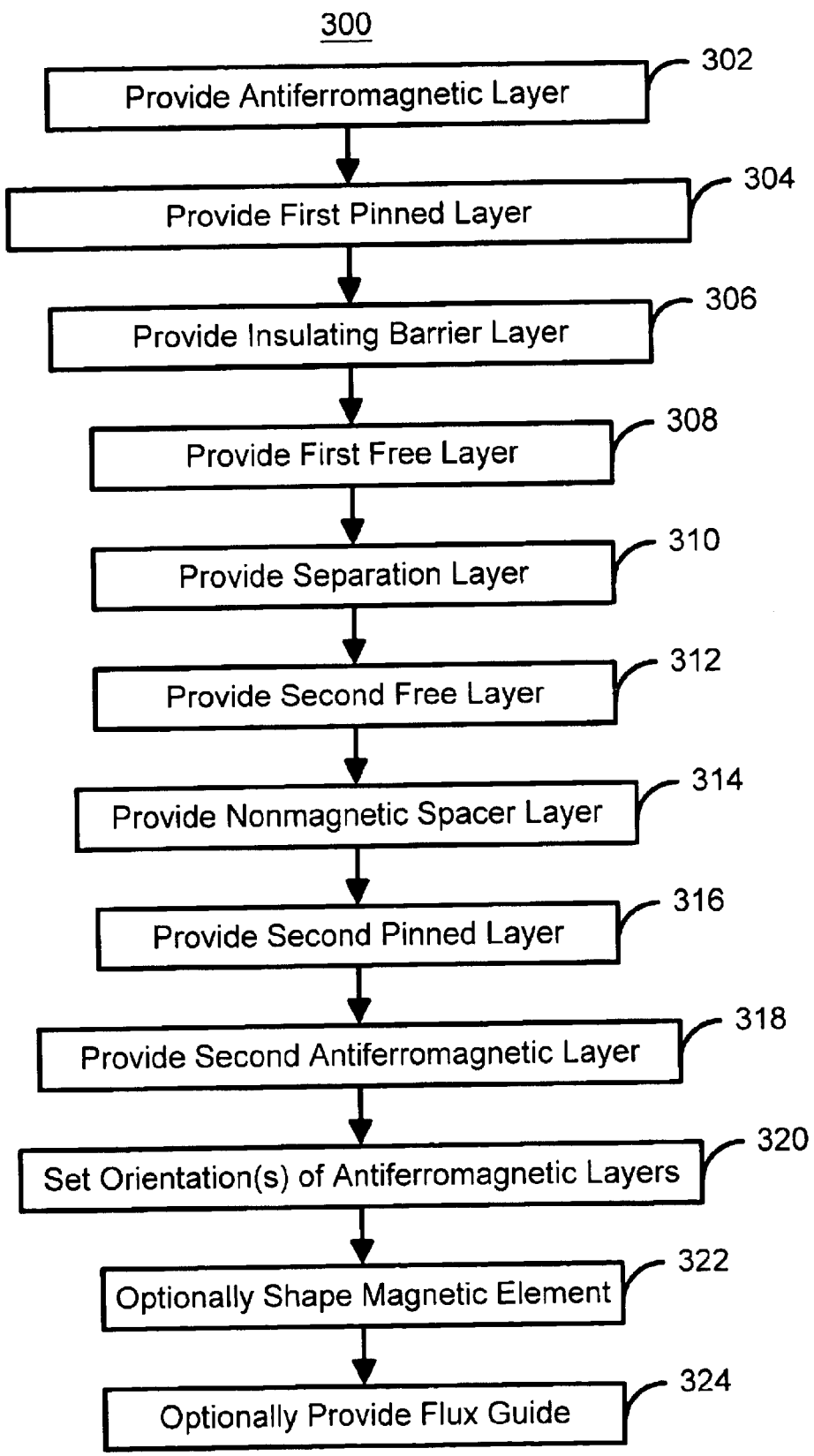
FIG. 11 is a high-level flow chart depicting one embodiment of a method in accordance with the present invention for providing a magnetic element in accordance with the present invention.

FIG. 11 is a high-level flow chart depicting one embodiment of a method 300 in accordance with the present invention for providing magnetic elements in accordance with the present invention. For clarity, the method 300 is described in the context of the materials layer sequence of magnetic element 100. However, the method 300 could be adapted to other magnetic elements, such as the materials layers outlined in 100', 100", 100''', 100'''', 150, and 150'. For example, additional steps could be added to form a dual spin valve and/or a dual spin tunneling junction as in the magnetic elements 150 and 150'. The first antiferromagnetic layer 110 is provided, via step 302. In a preferred embodiment, the antiferromagnetic layer 110 is provided on the appropriate seed layer 108. The first pinned layer 112 and the barrier layer 120 are provided in steps 304 and 306, respectively. Step 304 could also include providing ferromagnetic layers 114 and 118 separated by the spacer layer 116 such that the first pinned layer 112 is synthetic. The first free layer 122 is provided in step 308. Step 308 could include providing a synthetic free layer. The separation layer 106 is provided, via step 310. The second free layer 124 is provided, via step 312. Step 312 could include providing a synthetic free layer. The nonmagnetic spacer layer 126 is provided, via step 314. The second pinned layer 128 and second antiferromagnetic layer 136 are provided, via steps 316 and 318, respectively. The orientation(s) of the antiferromagnetic layers 110 and 136 are set, via step 320. Step 320 could include independently setting the orientations of the antiferromagnetic layers 110 and 136. Alternatively, step 320 could set the orientations of the antiferromagnetic layers 110 and 136 together. The magnetic element 100 can optionally be shaped, via step 322. Thus, step 322 is used to provide the shape of the magnetic elements 100", 100'", 100"", and 150. Consequently, in one embodiment, step 322 forms the magnetic element into an inverse T-shape. In another embodiment, the magnetic element is formed into a trapezoid using step 322. In addition, the flux guide 144/146 is optionally provided, via step 324. Preferably step 324 is only performed if a shaped magnetic element such as one of the magnetic elements 100", 100'", 100"", and 150 is being provided. Other processing for the magnetic element 100 could then be completed. Thus, using the method 300, the magnetic elements 100, 100', 100", 100'", 100"", 150 and/or 150' may be fabricated.

Figure 12A:
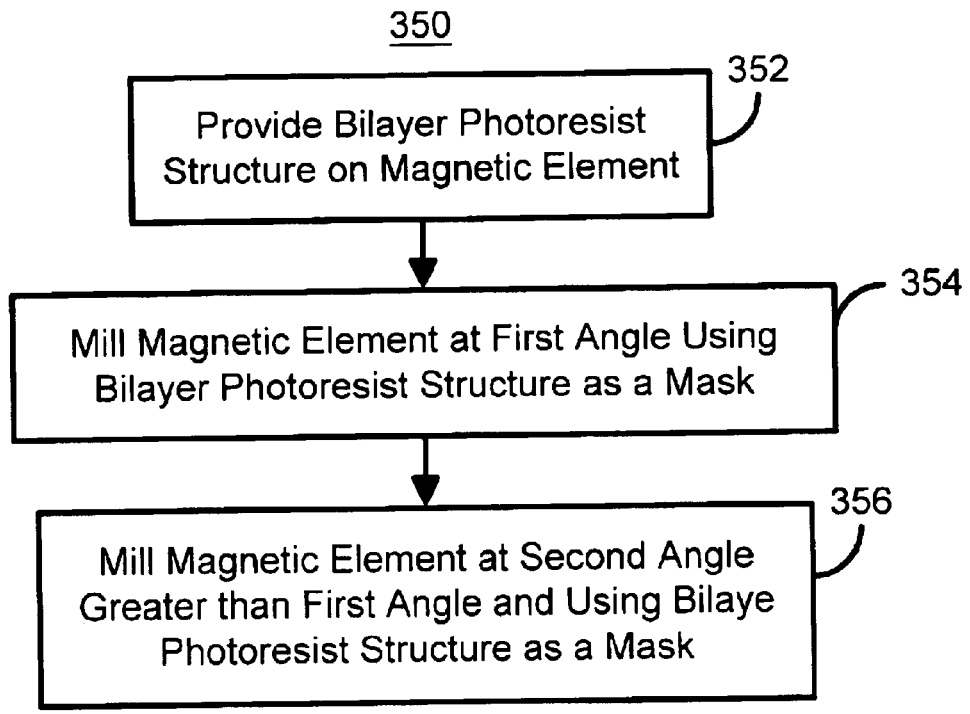
FIG. 12A is a flow chart of one embodiment of a method in accordance with the present invention for shaping the magnetic element to tailor the current density through the magnetic element.

FIG. 12A is a flow chart of one embodiment of a method 350 in accordance with the present invention for shaping the magnetic element to tailor the current density through the magnetic element. Thus, the method 350 could be used to perform step 322 and form the magnetic element 100" into a trapezoid. Although not depicted as being shaped, the method 350 could also be used to shape structures 100', 150 and 150' into a trapezoidal configuration. However, the method 250 is described in the context of the magnetic element 100". A bilayer photoresist structure (not shown) is provided on the magnetic element 100" (before it has been formed into a trapezoid), via step 352. The magnetic element 100" is milled at a first angle using the bilayer photoresist structure as a mask, via step 354. The first angle is measured from normal to the magnetic element. This forms the lower, spin tunneling junction 102" portion of the magnetic element. The magnetic element is then milled at a second angle, via step 356. The second angle is also measured from normal to the magnetic element and is larger than the first angle. Thus, the second angle will mill deeper into the magnetic element 100", forming the upper portion of the trapezoid where the spin valve 104" resides. Using the method 350, therefore, the magnetic element 100" can be formed.

Figure 12B:
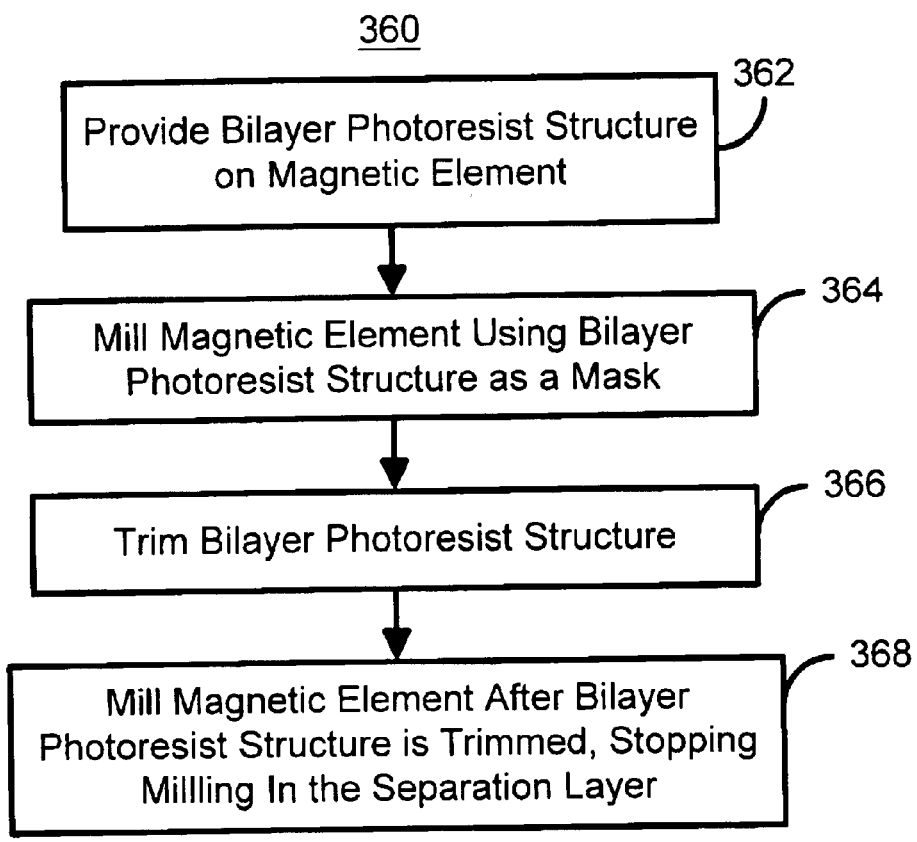
FIG. 12B is a flow chart of one embodiment of a method in accordance with the present invention for shaping the magnetic element to tailor the current density through the magnetic element.

FIG. 12B is a flow chart of one embodiment of a method 360 in accordance with the present invention for shaping the magnetic element into an inverse T-shape to tailor the current density through the magnetic element. Thus, the method 360 could be used to perform step 322 and shape the magnetic elements 100'", 100"", and 150 so that the spin valves are less wide than the spin tunneling junctions. Thus, the method 360 is described in the context of shaping the magnetic elements 100'", 100"", and 150. However, one of ordinary skill in the art will readily recognize that the method 360 is typically used on only one type of magnetic element at a time.

A bilayer photoresist structure is provided on the magnetic elements 100'", 100"", and 150 (before it has been shaped), via step 362. The magnetic elements are then milled using the bilayer photoresist structure as a mask, via step 364. Thus, the lower portion of the magnetic elements 100'", 100"", and 150, where the spin tunneling junctions 102'", 102"", and 152, are formed. The bilayer photoresist structure is then trimmed, via step 366. Preferably, step 366 includes cleaning any metal that has been redeposited in the milling step using a large angle ion mill. The bilayer photoresist mask is also preferably trimmed using a reactive ion etch or by a UV/bake step. Thus, the bilayer photoresist structure is smaller in width. The magnetic elements 100'", 100"", and 150 are then milled after the bilayer photoresist structure has been trimmed by stopping the mill in the interior of the separation layer using an end-point detector such as secondary ion mass spectroscopy (SIMS), via step 368. Step 368 thus forms the upper portion of the magnetic elements 100'", 100"", and 150, where the spin valves 104'", 104"", and 154 reside. Using the method 360, therefore, the magnetic elements 100'", 100"", and 150 can be formed.

Figure 12C:
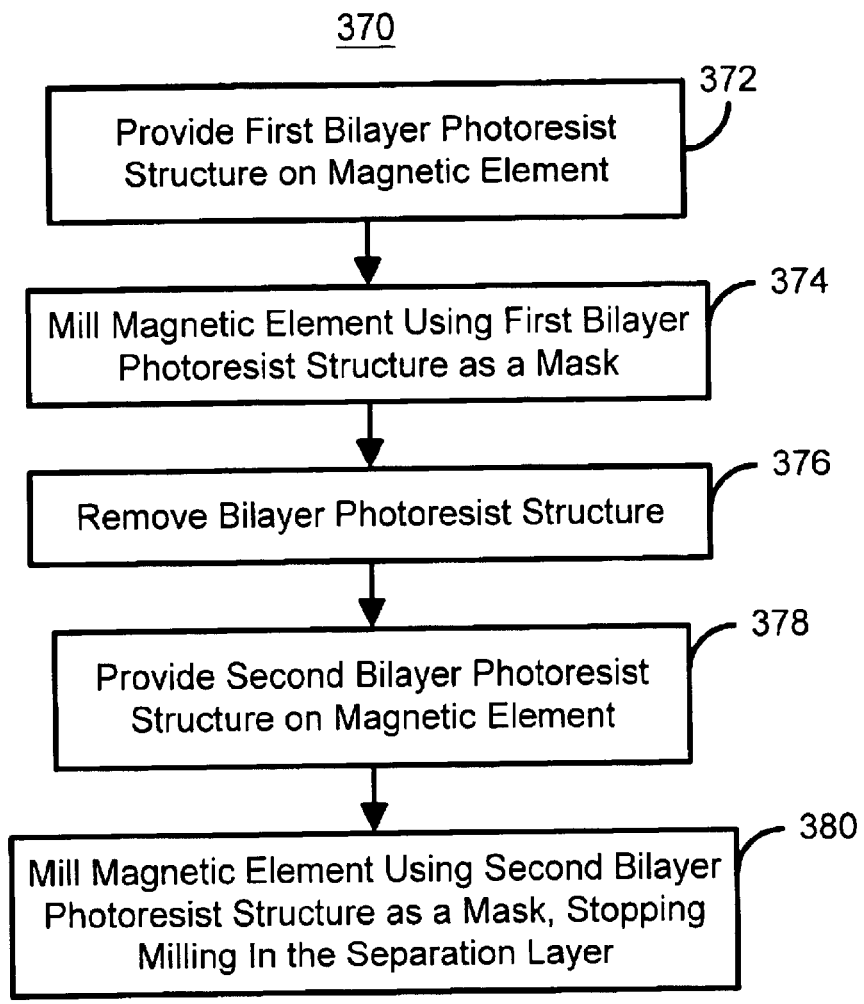
FIG. 12C is a flow chart of one embodiment of a method in accordance with the present invention for shaping the magnetic element to tailor the current density through the magnetic element.

FIG. 12C is a flow chart of one embodiment of a method 370 in accordance with the present invention for shaping the magnetic element into an inverse T-shape to tailor the current density through the magnetic elements 100'", 100'" and 150. Thus, the method 360 is described in the context of shaping the magnetic elements 100'", 100"", and 150. However, one of ordinary skill in the art will readily recognize that the method 360 is typically used on only one type of magnetic element at a time.

A first bilayer photoresist structure on the magnetic elements 100'", 100"" and 150, via step 372. The magnetic element is milled using the first bilayer photoresist structure as a mask, via step 374. The bottoms of the magnetic elements 100'", 100"" and 150, where the spin tunneling junctions 102'", 102"" and 152 reside, are thus provided. The first bilayer photoresist structure is removed, via step 376. A second bilayer photoresist structure that is less wide than the first bilayer photoresist structure is provided, via step 378. The magnetic elements are milled using the second bilayer photoresist structure as a mask stopping the mill at the middle of the separation layer using an end-point detector such as secondary ion mass spectroscopy (SIMS), via step 380. Consequently, step 380 shapes the upper portion of the magnetic elements 100'", 100"", and 150, where the spin valves reside. Thus, using the methods 300, 360 and/or 370, the magnetic elements 100'", 100"" and 150 can be provided.

Thus, using the methods 300, 350, 360 and/or 370, the magnetic elements 100, 100', 100", 100'", 100"", 150 and 150' can be provided. The magnetic elements 100, 100', 100", 100'", 100"", 150 and 150' can be written to using spin transfer, which is a more localized, reliable phenomenon. In addition, the free layers of the spin valve and spin tunneling junction can be separately tailored. Thus, the properties of the spin valves can be tailored to optimize spin transfer, while the properties of the spin tunneling junctions can be tailored to optimize the read signal. As a result, performance and reliability of the magnetic elements 100, 100', 100", 100'", 100"", 150 and 150' can be improved.

A method and system has been disclosed for providing a magnetic element that can be written using spin transfer, and thus a smaller and localized switching current, and which provides an adequate read signal. The magnetic element can have a geometry that allows for a lower current density through the barrier layer and has free layers that are magnetostatically coupled to ensure the appropriate alignment. Consequently, the free layers for the spin valve and spin tunneling junction can be separately tailored and performance and reliability can be improved. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
   a spin tunneling junction having a first free layer, a barrier layer and a first pinned layer, the first pinned layer being ferromagnetic and having a first pinned layer magnetization, the first pinned layer magnetization being pinned in a first direction, the first free layer being ferromagnetic and having a first free layer magnetization, the barrier layer being an insulator and having a thickness that allows tunneling through the barrier layer, the barrier layer also residing between the first pinned layer and the first free layer;

a spin valve having a second pinned layer, a nonmagnetic spacer layer and a second free layer, the second pinned layer being ferromagnetic and having a second pinned layer magnetization, the second pinned layer magnetization being pinned in a second direction, the second free layer being ferromagnetic and having a second free layer magnetization, the nonmagnetic spacer layer being conductive and residing between the second free layer and the second pinned layer;

a separation layer residing between the first free layer of the spin tunneling junction and the second free layer of the spin valve, the separation layer being configured to allow the first free layer and the second free layer to be magnetostatically coupled;

wherein the magnetic element is configured to allow the second free layer magnetization to change direction due to spin transfer when a write current is passed through the magnetic element.

2. The magnetic element of claim 1 wherein the first free layer and the second free layer are magnetostatically coupled such that the first free layer magnetization is anti-parallel to the second free layer magnetization.

3. The magnetic element of claim 1 wherein the second pinned layer of the spin valve is a synthetic pinned layer including a first ferromagnetic layer and a second ferromagnetic layer separated by a second nonmagnetic spacer layer, the first ferromagnetic layer and the second ferromagnetic layer being antiferromagnetically coupled.

4. The magnetic element of claim 3 wherein the first pinned layer of the spin tunneling junction is a second synthetic pinned layer including a third ferromagnetic layer and a fourth ferromagnetic layer separated by a third nonmagnetic spacer layer, the third ferromagnetic layer and the fourth ferromagnetic layer being antiferromagnetically coupled.

5. The magnetic element of claim 1 wherein the spin valve further includes a first antiferromagnetic layer adjacent to the second pinned layer, the first antiferromagnetic layer for pinning the second pinned layer magnetization of the second pinned layer.

6. The magnetic element of claim 5 wherein the spin tunneling junction further includes a second antiferromagnetic layer adjacent to the first pinned layer, the second antiferromagnetic layer for pinning the first pinned layer magnetization of the first pinned layer.

7. The magnetic element of claim 1 wherein the spin valve has a first width, a first depth and a first dimension, the first dimension being the first width multiplied by the first depth and the spin tunneling junction has a second width, a second depth and a second dimension, the second dimension being the second width multiplied by the second depth, the first dimension being less than the second dimension.

8. The magnetic element of claim 7 wherein the magnetic element has a top, a bottom and a trapezoidal shape, the spin valve residing at the top of the magnetic element and the spin tunneling junction residing at the bottom of the magnetic element so that the first dimension is less than the second width dimension.

9. The magnetic element of claim 7 wherein the magnetic element has an inverse T-shape having a base and a vertical portion, the base being wider than the vertical portion, the spin valve residing in the vertical potion and the spin tunneling junction residing in the base.

10. The magnetic element of claim 1 further comprising a flux guide and an insulating layer, the flux guide having a first end and a second end, a portion of the first end being in proximity to the first free layer, a portion of the second end being in proximity to the second free layer, the insulating layer residing between the flux guide and the first free layer, the second free layer and the separation layer.

11. The magnetic element of claim 1 wherein the separation layer is sufficiently thick to avoid exchange coupling of the first free layer and the second free layer.

12. The magnetic element of claim 1 wherein the separation layer includes material having a short spin diffusion length.

13. The magnetic element of claim 12 wherein the separation layer includes at least one of Pt, Mn, a Cu/CuPt sandwich or a CuMn/Cu sandwich.

14. The magnetic element of claim 13 wherein the separation layer has a thickness and the short spin diffusion length is less than or equal to the thickness of the separation layer.

15. The magnetic element of claim 1 wherein the spin valve further includes a second nonmagnetic spacer layer, a third pinned layer and an antiferromagnetic layer adjacent to the third pinned layer, the second nonmagnetic spacer layer residing between the third pinned layer and the second free layer such that the second free layer is between the nonmagnetic spacer layer and the second nonmagnetic spacer layer.

16. The magnetic element of claim 1 wherein the spin tunneling junction further includes a second barrier layer, a third pinned layer, and an antiferromagnetic layer adjacent to the third pinned layer, the second barrier layer residing between the third pinned layer and the first free layer such that the first free layer is between the barrier layer and the second barrier layer.

17. A magnetic element comprising:
a dual spin tunneling junction having a first pinned layer, a first barrier layer, a first free layer, a second barrier layer and a second pinned layer, the first barrier layer residing between the first pinned layer and the first free layer, the second barrier layer residing between the first free layer and the second pinned layer, the first pinned layer being ferromagnetic and having a first pinned layer magnetization pinned in a first direction, the second pinned layer being ferromagnetic and having a second pinned layer magnetization pinned in a second direction, the first free layer being ferromagnetic and having a first free layer magnetization, the first barrier layer being an insulator and having a first thickness that allows tunneling through the first barrier layer, the second barrier layer being an insulator and having a second thickness that allows tunneling through the second barrier layer;
a dual spin valve having a third pinned layer, a first nonmagnetic spacer layer, a second free layer, a second nonmagnetic spacer layer and a fourth pinned layer, the first nonmagnetic spacer residing between the third pinned layer and the second free layer, the second nonmagnetic spacer residing between the second free layer and the fourth pinned layer, the third pinned layer being ferromagnetic and having a third pinned layer magnetization pinned in the second direction, the fourth pinned layer being ferromagnetic and having a fourth pinned layer magnetization pinned in the first direction, the second free layer being ferromagnetic and having a second free layer magnetization, the first free layer and the second free layer being magnetostatically coupled, the first nonmagnetic spacer layer and the second nonmagnetic spacer layer being conductive;

an antiferromagnetic layer residing between the second pinned layer of the spin tunneling junction and the third pinned layer of the spin valve, the antiferromagnetic layer being configured to pin the second magnetization in the second direction and the third magnetization in the second direction;

wherein the magnetic element is configured to allow the second free layer magnetization to change direction due to spin transfer when a write current is passed through the magnetic element.

18. The magnetic element of claim 17 wherein the first free layer and the second free layer are magnetostatically coupled such that the first free layer magnetization is antiparallel to the second free layer magnetization.

19. The magnetic element of claim 17 wherein the dual spin valve has a first width, a first depth and a first dimension, the first dimension being the first width multiplied by the first depth and the dual spin tunneling junction has a second width, a second depth and a second dimension, the second dimension being the second width multiplied by the second depth, the first dimension being less than the second dimension.

20. The magnetic element of claim 19 wherein the magnetic element has a top, a bottom and a trapezoidal shape, the dual spin valve residing at the top of the magnetic element and the dual spin tunneling junction residing at the bottom of the magnetic element so that the first dimension is less than the second width dimension.

21. The magnetic element of claim 19 wherein the magnetic element has an inverse T-shape having a base and a vertical portion, the base being wider than the vertical portion, the dual spin valve residing in the vertical potion and the dual spin tunneling junction residing in the base.

22. A magnetic memory device comprising:

a plurality of magnetic cells including a plurality of magnetic elements, each of the plurality of magnetic elements including a spin tunneling junction, a spin valve, and a separation layer, the spin tunneling junction having a first free layer, a barrier layer and a first pinned layer, the first pinned layer being ferromagnetic and having a first pinned layer magnetization, the first pinned layer magnetization being pinned in a first direction, the first free layer being ferromagnetic and having a first free layer magnetization, the barrier layer being an insulator and having a thickness that allows tunneling through the barrier layer, the barrier layer also residing between the first pinned layer and the first free layer, the spin valve having a second pinned layer, a nonmagnetic spacer layer and a second free layer, the second pinned layer being ferromagnetic and having a second pinned layer magnetization, the second pinned layer magnetization being pinned in a second direction, the second free layer being ferromagnetic and having a second free layer magnetization, the nonmagnetic spacer layer being conductive and residing between the second free layer and the second pinned layer, the separation layer residing between the first free layer of the spin tunneling junction and the second free layer of the spin valve, the separation layer being configured to allow the first free layer and the second free layer to be magnetostatically coupled such that the first free layer magnetization is antiparallel to the second free layer magnetization, wherein the magnetic element is configured to allow the second free layer magnetization to change direction due to spin transfer when a write current is passed through the magnetic element;

a plurality of row lines coupled to the plurality of magnetic cells; and a plurality of column lines coupled with the plurality of cells, the plurality of row lines and the plurality of column lines for selecting a portion of the plurality of magnetic cells for reading and writing.

23. A magnetic memory device comprising:

a plurality of magnetic cells including a plurality of magnetic elements, each of the plurality of magnetic elements including a dual spin tunneling junction, a dual spin valve and an antiferromagnetic layer, the dual spin tunneling junction having a first pinned layer, a first barrier layer, a first free layer, a second barrier layer and a second pinned layer, the first barrier layer residing between the first pinned layer and the first free layer, the second barrier layer residing between the first free layer and the second pinned layer, the first pinned layer being ferromagnetic and having a first pinned layer magnetization pinned in a first direction, the second pinned layer being ferromagnetic and having a second pinned layer magnetization pinned in a second direction, the first free layer being ferromagnetic and having a first free layer magnetization, the first barrier layer being an insulator and having a first thickness that allow tunneling through the first barrier layer, the second barrier layer being an insulator and having a second thickness that allow tunneling through the second barrier layer, the dual spin valve having a third pinned layer, a first nonmagnetic spacer layer, a second free layer, a second nonmagnetic spacer layer and a fourth pinned layer, the first nonmagnetic spacer residing between the third pinned layer and the second free layer, the second nonmagnetic spacer residing between the second free layer and the fourth pinned layer, the third pinned layer being ferromagnetic and having a third pinned layer magnetization pinned in the second direction, the fourth pinned layer being ferromagnetic and having a fourth pinned layer magnetization pinned in the first direction, the second free layer being ferromagnetic and having a second free layer magnetization, the first nonmagnetic spacer layer and the second nonmagnetic spacer layer being conductive, the antiferromagnetic layer residing between the second pinned layer of the spin tunneling junction and the third pinned layer of the spin valve, the antiferromagnetic layer being configured to pin the second magnetization in the second direction and the third magnetization in the second direction, the first free layer and the second free layer being magnetostatically coupled, the magnetic element being configured to allow the second free layer magnetization to change direction due to spin transfer when a write current is passed through the magnetic element;

a plurality of row lines coupled to the plurality of magnetic cells; and a plurality of column lines coupled with the plurality of cells, the plurality of row lines and the plurality of column lines for selecting a portion of the plurality of magnetic cells for reading and writing.

24. A method for utilizing a magnetic memory comprising the steps of:

(a) in a write mode, writing to a first portion of a plurality of magnetic cells by driving a write current in a CPP configuration through the a first portion of a plurality of magnetic elements, each of the magnetic elements a plurality of magnetic cells including a spin tunneling junction, a spin valve, and a separation layer, the spin tunneling junction having a first free layer, a barrier layer and a first pinned layer, the first pinned layer being ferromagnetic and having a first pinned layer magnetization, the first pinned layer magnetization being pinned in a first direction, the first free layer being ferromagnetic and having a first free layer magnetization, the barrier layer being an insulator and having a thickness that allows tunneling through the barrier layer, the barrier layer also residing between the first pinned layer and the first free layer, the spin valve having a second pinned layer, a nonmagnetic spacer layer and a second free layer, the second pinned layer being ferromagnetic and having a second pinned layer magnetization, the second pinned layer magnetization being pinned in a second direction, the second free layer being ferromagnetic and having a second free layer magnetization, the nonmagnetic spacer layer being conductive and residing between the second free layer and the second pinned layer, the separation layer residing between the first free layer of the spin tunneling junction and the second free layer of the spin valve, the separation layer being configured to allow the first free layer and the second free layer to be magnetostatically coupled, wherein the magnetic element is configured to allow the second free layer magnetization to change direction due to spin transfer when a write current is passed through the magnetic element;

(b) in a read mode, reading a signal from a second portion of the plurality of cells.

25. A method for utilizing a magnetic memory comprising the steps of:

(a) in a write mode, writing to a first portion of a plurality of magnetic cells by driving a write current in a CPP configuration through the a first portion of a plurality of magnetic elements, each of the magnetic elements a plurality of magnetic cells including a dual spin tunneling junction, a dual spin valve and an antiferromagnetic layer, the dual spin tunneling junction having a first pinned layer, a first barrier layer, a first free layer, a second barrier layer and a second pinned layer, the first barrier layer residing between the first pinned layer and the first free layer, the second barrier layer residing between the first free layer and the second pinned layer, the first pinned layer being ferromagnetic and having a first pinned layer magnetization pinned in a first direction, the second pinned layer being ferromagnetic and having a second pinned layer magnetization pinned in a second direction, the first free layer being ferromagnetic and having a first free layer magnetization, the first barrier layer being an insulator and having a first thickness that allow tunneling through the first barrier layer, the second barrier layer being an insulator and having a second thickness that allow tunneling through the second barrier layer, the dual spin valve having a third pinned layer, a first nonmagnetic spacer layer, a second free layer, a second nonmagnetic spacer layer and a fourth pinned layer, the first nonmagnetic spacer residing between the third pinned layer and the second free layer, the second nonmagnetic spacer residing between the second free layer and the fourth pinned layer, the third pinned layer being ferromagnetic and having a third pinned layer magnetization pinned in the second direction, the fourth pinned layer being ferromagnetic and having a fourth pinned layer magnetization pinned in the first direction, the second free layer being ferromagnetic and having a second free layer magnetization, the first nonmagnetic spacer layer and the second nonmagnetic spacer layer being conductive, the antiferromagnetic layer residing between the second pinned layer of the spin tunneling junction and the third pinned layer of the spin valve, the antiferromagnetic layer being configured to pin the second magnetization in the second direction and the third magnetization in the second direction, the first free layer and the second free layer being magnetostatically coupled, the magnetic element being configured to allow the second free layer magnetization to change direction due to spin transfer when a write current is passed through the magnetic element;

(b) in a read mode, reading a signal from a second portion of the plurality of cells.

26. A method for providing magnetic element comprising the steps of:

(a) providing a first pinned layer, the first pinned layer being ferromagnetic and having a first pinned layer magnetization, the first pinned layer magnetization being pinned in a first direction;

(b) providing a barrier layer, the barrier layer being an insulator and having a thickness that allows tunneling through the barrier layer;

(c) providing a first free layer, the first free layer being ferromagnetic and having a first free layer magnetization, the barrier layer residing between the first pinned layer and the first free layer, the first pinned layer, the barrier layer and the first free layer being included in a spin tunneling junction;

(d) providing a separation layer;

(e) providing a second free layer, the second free layer being ferromagnetic and having a second free layer magnetization, the separation layer residing between the first free layer and the second free layer and being configured to allow the first free layer and the second free layer to be magnetostatically coupled;

(f) providing a nonmagnetic spacer layer, the nonmagnetic spacer layer being conductive;

(g) providing a second pinned layer, the second pinned layer being ferromagnetic and having a second pinned layer magnetization, the second pinned layer magnetization being pinned in a second direction, the nonmagnetic spacer layer residing between the second pinned layer and the second free layer, the second free layer, the second pinned layer and the nonmagnetic spacer layer being included in a spin valve;

wherein the magnetic element is configured to allow the second free layer magnetization to change direction due to spin transfer when a write current is passed through the magnetic element.

27. The method of claim 26 wherein the first free layer and the second free layer are magnetostatically coupled such that the first free layer magnetization is antiparallel to the second free-layer magnetization.

28. The method of claim 26 wherein the step of providing the second pinned layer (g) includes the step of:

(g1) providing a synthetic pinned layer for the second pinned layer, the synthetic pinned layer including a first ferromagnetic layer and a second ferromagnetic layer separated by a second nonmagnetic spacer layer, the first ferromagnetic layer and the second ferromagnetic layer being antiferromagnetically coupled.

29. The method of claim 28 wherein the step of providing the first pinned layer (a) includes the step of:
  (a1) providing a second synthetic pinned layer for the first pinned layer of the spin tunneling junction, the second synthetic pinned layer including a third ferromagnetic layer and a fourth ferromagnetic layer separated by a third nonmagnetic spacer layer, the third ferromagnetic layer and the fourth ferromagnetic layer being antiferromagnetically coupled.

30. The method of claim 26 further comprising the steps of:
  (h) providing a first antiferromagnetic layer adjacent to the first pinned layer, the first antiferromagnetic layer for pinning the first pinned layer magnetization of the first pinned layer.

31. The method of claim 30 further comprising the step of
  (i) providing a second antiferromagnetic layer adjacent to the second pinned layer, the second antiferromagnetic layer for pinning the second pinned layer magnetization of the second pinned layer.

32. The method of claim 26 wherein the spin valve has a first width, a first depth and a first dimension, the first dimension being the first width multiplied by the first depth and the spin tunneling junction has a second width, a second depth and a second dimension, the second dimension being the second width multiplied by the second depth, method further comprising the step of:
  (h) ensuring that the first dimension is less than the second dimension.

33. The method of claim 32 wherein the ensuring step (h) further includes the step of:
  (h1) shaping the magnetic element to have a trapezoidal shape such that the magnetic element has a top and a bottom wider than the top, the spin valve at the top of the magnetic element and the spin tunneling junction at the bottom of the magnetic element so that the first dimension is less than the second dimension.

34. The method of claim 33 wherein the shaping step (h1) further includes the steps of:
  (h1i) providing a bilayer photoresist structure on the magnetic element;
  (h1ii) milling the magnetic element at a first angle and using the bilayer photoresist structure as a mask, the first angle being measured from normal to the magnetic element; and
  (h1iii) milling the magnetic element at a second angle, the second angle being measured from normal to the magnetic element and being larger than the first angle.

35. The method of claim 33 wherein the shaping step (h1) further includes the steps of:
  (h1i) providing a bilayer photoresist structure on the magnetic element;
  (h1ii) milling the magnetic element using the bilayer photoresist structure as a mask;
  (h1iii) trimming the bilayer photoresist structure; and
  (h1iv) milling the magnetic element after the bilayer photoresist structure has been trimmed.

36. The method of claim 33 wherein the shaping step (h1) further includes the steps of: p1 (h1i) providing a first bilayer photoresist structure on the magnetic element;
  (h1ii) milling the magnetic element using the first bilayer photoresist structure as a mask;
  (h1iii) providing a second bilayer photoresist structure that is less wide than the first bilayer photoresist structure; and
  (h1iv) milling the magnetic element using the second bilayer photoresist structure as a mask.

37. The method of claim 32 wherein the ensuring step (h) further includes the step of:
  (h1) shaping magnetic element into an inverse T-shape having a base and a vertical portion, the base being wider than the vertical portion, the spin valve residing in the vertical potion and the spin tunneling junction residing in the base.

38. The method of claim 26 further comprising the step of:
  (h) providing an insulating layer; and
  (i) providing a flux guide, the flux guide having a first end and a second end, a portion of the first end being in proximity to the first free layer, a portion of the second end being in proximity to the second free layer, the insulating layer residing between the flux guide and the first free layer, the second free layer and the separation layer.

39. The method of claim 26 wherein the separation layer is sufficiently thick to avoid exchange coupling of the first free layer and the second free layer.

40. The method of claim 26 wherein the separation layer includes material having a short spin diffusion length.

41. The method of claim 40 wherein the separation layer has a thickness and the short diffusion length is less than or equal to the thickness of the separation layer.

42. The method of claim 40 wherein the separation layer includes at least one of Pt, Mn, a Cu/CuPt sandwich or a CuMn/Cu sandwich.

43. The method of claim 26 further comprising the steps of:
  (i) providing a second nonmagnetic spacer layer for the spin valve;
  (j) providing a third pinned layer for the spin valve, the second nonmagnetic spacer residing between the third pinned layer and the second free layer such that the second free layer is between the nonmagnetic spacer layer and the second nonmagnetic spacer layer; and
  (k) providing an antiferromagnetic layer adjacent to the third pinned layer.

44. The method of claim 26 further comprising the steps of:
  (i) providing a second barrier layer for the spin tunneling junction;
  (j) providing a third pinned layer for the spin tunneling junction, the second barrier layer residing between the third pinned layer and the first free layer such that the first free layer is between the barrier layer and the second barrier layer; and
  (k) providing an antiferromagnetic layer adjacent to the third pinned layer.

45. A method for providing magnetic element comprising the steps of:
  (a) providing a first pinned layer, the first pinned layer being ferromagnetic and having a first pinned layer magnetization, the first pinned layer magnetization being pinned in a first direction;
  (b) providing a first barrier layer, the first barrier layer being insulating and having a first thickness that allows tunneling through the first barrier layer;
  (c) providing a first free layer, the first free layer being ferromagnetic and having a first free layer magnetization, the barrier layer residing between the first pinned layer and the first free layer, the first pinned layer;

(d) providing a second barrier layer, the second barrier layer being insulating and having a second thickness that allows tunneling through the second barrier layer;

(e) providing a second pinned layer, the second pinned layer being ferromagnetic and having a second pinned layer magnetization, the second pinned layer magnetization being pinned in a second direction, the first pinned layer, the first barrier layer, the first free layer, the second barrier layer and the second pinned layer being included in a spin tunneling junction;

(f) providing an antiferromagnetic layer;

(g) providing a third pinned layer, the third pinned layer being ferromagnetic and having a third pinned layer magnetization, the antiferromagnetic layer pinning the second magnetization of the second pinned layer and the third pinned layer magnetization in the second direction;

(h) providing a first nonmagnetic spacer layer, the first nonmagnetic spacer layer being conductive;

(i) providing a second free layer, the second free layer being ferromagnetic and having a second free layer magnetization, the first free layer and the second free layer being magnetostatically coupled;

(f) providing a nonmagnetic spacer layer, the nonmagnetic spacer layer being conductive;

(g) providing a second pinned layer, the second pinned layer being ferromagnetic and having a second pinned layer magnetization, the second pinned layer magnetization being pinned in a second direction, the nonmagnetic spacer layer residing between the second pinned layer and the second free layer, the second free layer, the second pinned layer and the nonmagnetic spacer layer being included in a spin valve;

wherein the magnetic element is configured to allow the second free layer magnetization to change direction due to spin transfer when a write current is passed through the magnetic element.

* * * * *